United States Patent
Song et al.

(10) Patent No.: US 11,940,637 B2
(45) Date of Patent: Mar. 26, 2024

(54) COLOR TRANSFORMATION FILTER AND DISPLAY DEVICE INCLUDING THE SAME

(71) Applicants: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

(72) Inventors: Sunjin Song, Seoul (KR); Seokho Song, Seoul (KR); Wonjae Joo, Seongnam-si (KR); Myongjong Kwon, Suwon-si (KR)

(73) Assignees: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 17/666,084

(22) Filed: Feb. 7, 2022

(65) Prior Publication Data

US 2023/0082071 A1 Mar. 16, 2023

(30) Foreign Application Priority Data

Sep. 14, 2021 (KR) .......................... 10-2021-0122769

(51) Int. Cl.
*H10K 59/35* (2023.01)
*G02B 5/22* (2006.01)
(Continued)

(52) U.S. Cl.
CPC .......... *G02B 5/223* (2013.01); *H10K 59/1213* (2023.02); *H10K 59/123* (2023.02); *H10K 59/35* (2023.02)

(58) Field of Classification Search
CPC .......... H10K 59/35–353; H10K 59/38; H10K 50/854; H01L 33/50–508; G02F 1/133514
See application file for complete search history.

(56) References Cited

U.S. PATENT DOCUMENTS 8,614,698 B2 12/2013 Desieres et al.
9,425,245 B2 8/2016 Song et al.
(Continued)

FOREIGN PATENT DOCUMENTS

CN 111505904 A 8/2020
EP 3754712 A1 12/2020
(Continued)

OTHER PUBLICATIONS

Communication dated Aug. 12, 2022 by the European Patent Office in European Patent Application No. 22159199.3.

*Primary Examiner* — Mariceli Santiago
(74) *Attorney, Agent, or Firm* — Sughrue Mion, PLLC

(57) ABSTRACT

Provided is a color transformation filter including a plurality of nanostructures included in a subpixel and spaced apart from each other, the plurality of nanostructures having a first refractive index, a low refractive index layer provided adjacent to the plurality of nanostructures, the low refractive index layer having a second refractive index less than the first refractive index, and a color transformation element included in the low refractive index layer.

28 Claims, 22 Drawing Sheets

(51) Int. Cl.
    *H10K 59/121*     (2023.01)
    *H10K 59/123*     (2023.01)

(56) References Cited

U.S. PATENT DOCUMENTS

| | | | |
|---|---|---|---|
| 10,079,358 | B2 | 9/2018 | Song et al. |
| 10,615,372 | B2 | 4/2020 | Joo et al. |
| 10,903,454 | B2 | 1/2021 | Joo et al. |
| 10,950,823 | B2 | 3/2021 | Kyoung et al. |
| 11,038,148 | B2 | 6/2021 | Kyoung et al. |
| 2007/0103056 | A1 | 5/2007 | Cok |
| 2007/0200492 | A1 | 8/2007 | Cok et al. |
| 2012/0025185 | A1 | 2/2012 | Kasamatsu |
| 2012/0326180 | A1* | 12/2012 | Ohe .................... H10K 59/38 257/98 |
| 2014/0153216 | A1 | 6/2014 | Yamanaka et al. |
| 2017/0170220 | A1 | 6/2017 | Nam et al. |
| 2019/0013364 | A1 | 1/2019 | Yokota |
| 2019/0198816 | A1 | 6/2019 | Park et al. |
| 2019/0393439 | A1 | 12/2019 | Jankus et al. |
| 2020/0044177 | A1 | 2/2020 | Kim et al. |
| 2020/0052209 | A1 | 2/2020 | Heggemann et al. |
| 2020/0075876 | A1 | 3/2020 | Zhu et al. |
| 2020/0119233 | A1* | 4/2020 | Dupont .................... H01L 33/504 |
| 2020/0312916 | A1* | 10/2020 | Kim .................... H10K 50/115 |
| 2021/0159278 | A1* | 5/2021 | Lee .................... H10K 50/854 |
| 2021/0280750 | A1* | 9/2021 | Park .................... H10K 59/38 |
| 2021/0280832 | A1 | 9/2021 | Koo et al. |
| 2021/0288290 | A1 | 9/2021 | Lee et al. |
| 2021/0296616 | A1 | 9/2021 | Song et al. |
| 2021/0366964 | A1 | 11/2021 | Ito et al. |
| 2021/0408138 | A1 | 12/2021 | Kim et al. |
| 2022/0020828 | A1 | 1/2022 | Lee et al. |
| 2022/0020949 | A1 | 1/2022 | Bae et al. |
| 2022/0020963 | A1 | 1/2022 | Lee et al. |
| 2022/0037613 | A1 | 2/2022 | Song et al. |
| 2022/0158123 | A1 | 5/2022 | Koo et al. |
| 2022/0246707 | A1 | 8/2022 | Choi et al. |
| 2022/0271259 | A1 | 8/2022 | Song et al. |

FOREIGN PATENT DOCUMENTS

| | | |
|---|---|---|
| KR | 10-2017-0070685 A | 6/2017 |
| KR | 10-1941573 B1 | 1/2019 |
| KR | 10-2019-0135778 A | 12/2019 |
| KR | 10-2020-0098490 A | 8/2020 |
| KR | 10-2250527 B1 | 5/2021 |
| WO | 2020/232225 A1 | 11/2020 |

* cited by examiner

COLOR TRANSFORMATION FILTER AND DISPLAY DEVICE INCLUDING THE SAME

CROSS-REFERENCE TO RELATED APPLICATION

This application is based on and claims priority under 35 U.S.C. § 119 to Korean Patent Application No. 10-2021-0122769, filed on Sep. 14, 2021, in the Korean Intellectual Property Office, the disclosure of which is incorporated by reference herein in its entirety.

BACKGROUND

1. Field

Example embodiments of the present disclosure relate to a color transformation filter and a display device including the same.

2. Description of Related Art

Various display devices, such as liquid crystal displays (LCDs), organic light emitting diode (OLED) displays, displays using micro light emitting diodes, etc. have been developed.

An OLED display is a self light emitting device that not only has a relatively wide viewing angle and high contrast but also a high response speed and other excellent characteristics in terms of a driving voltage, brightness, polychrome facilitation, etc.

In the OLED display, a hole provided from an anode and an electron provided from a cathode combine in an organic light emitting layer that emits light to form an image. The OLED display has excellent display characteristics such as a wide viewing angle, high response speed, thin thickness, low manufacturing cost, high contrast, etc. Further, by selecting a proper material as a material of an organic light emitting layer in the OLED display, a desired color may be emitted. According to this principle, a color display device may be implemented using the OLED.

SUMMARY

One or more example embodiments provide color transformation filters configured to transform and filter colors of light radiated from a light source.

One or more example embodiments also provide display devices including color transformation filters configured to transform and filter colors of light.

Additional aspects will be set forth in part in the description which follows and, in part, will be apparent from the description, or may be learned by practice of example embodiments.

According to an aspect of an example embodiment, there is provided a color transformation filter including a plurality of nanostructures included in a subpixel and spaced apart from each other, the plurality of nanostructures having a first refractive index, a low refractive index layer provided adjacent to the plurality of nanostructures, the low refractive index layer having a second refractive index less than the first refractive index, and a color transformation element included in the low refractive index layer.

The plurality of nanostructures may be configured to output color light having a full width of half maximum less than or equal to 15 nm.

A full width of half maximum of color light of each subpixel may be determined by at least one of a duty cycle of the plurality of nanostructures, a height of the plurality of nanostructures, and an arrangement period of the plurality of nanostructures.

An arrangement period of the plurality of nanostructures and a height of the plurality of nanostructures may be respectively less than a wavelength of color light corresponding to the subpixel.

A partition wall may be provided between subpixels including the subpixel.

The plurality of nanostructures may include an oxide or a semiconductor material.

The plurality of nanostructures may include at least one of $TiO_2$, $HfO_2$, $BaTiO_3$, and $Cr_2O_3$.

The plurality of nanostructures may include at least one of Si, ZnS, ZnSe, GaP, InP, GaAs, GaN, and $AlAs_2$.

The low refractive index layer may include $SiO_2$, acrylic, or curable epoxy resin.

The color transformation filter may have a multilayer structure.

The plurality of nanostructures in the multilayer structure may be provided at a same position based on a layer or are shifted based on a layer.

According to another aspect of an example embodiment, there is provided a display device including a light source, and a color transformation filter configured to output color light corresponding to each of subpixels based on light radiated from the light source, wherein the color transformation filter includes a plurality of nanostructures included in the subpixels and spaced apart from each other, the plurality of nanostructures having a first refractive index, a low refractive index layer provided adjacent to the plurality of nanostructures, the low refractive index layer having a second refractive index less than the first refractive index, and a color transformation element included in the low refractive index layer.

The plurality of nanostructures may be configured to output color light having a full width of half maximum less than or equal to 15 nm.

A full width of half maximum of color light of each subpixel may be determined by at least one of a duty cycle of the plurality of nanostructures, a height of the plurality of nanostructures, and an arrangement period of the plurality of nanostructures.

The arrangement of the plurality of nanostructures period and the height of the plurality of nanostructures may be respectively less than a wavelength of color light corresponding to the subpixel.

A partition wall may be provided between subpixels including the subpixel.

The plurality of nanostructures may include an oxide or a semiconductor material.

The plurality of nanostructures may include at least one of $TiO_2$, $HfO_2$, $BaTiO_3$, and $Cr_2O_3$.

The plurality of nanostructures may include at least one of Si, ZnS, ZnSe, GaP, InP, GaAs, GaN, and $AlAs_2$.

The low refractive index layer may include $SiO_2$, acrylic, or curable epoxy resin.

The color transformation filter may have a multilayer structure.

The plurality of nanostructures in the multilayer structure may be provided at a same position based on a layer or are shifted based on a layer.

The light source may include a first electrode, an organic light emitting layer provided on the first electrode, and a second electrode provided on the organic light emitting layer.

The organic light emitting layer may include a blue light emitting layer.

The organic light emitting layer may include a blue light emitting layer and a green light emitting layer.

The organic light emitting layer may include a plurality of organic light emitting layers, and a charge generation layer provided between adjacent organic light emitting layers among the plurality of organic light emitting layers.

The light source may include a first electrode, an n-type semiconductor layer, an inorganic light emitting layer, a p-type semiconductor layer, and a second electrode.

According to another aspect of an example embodiment, there is provided a color transformation filter including a pixel including a plurality of subpixels, a plurality of nanostructures included in each of the plurality of subpixels and spaced apart from each other, the plurality of nanostructures having a first refractive index, a low refractive index layer provided adjacent to the plurality of nanostructures, the low refractive index layer having a second refractive index less than the first refractive index, and quantum dots included in the low refractive index layer.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION

Figure 1:
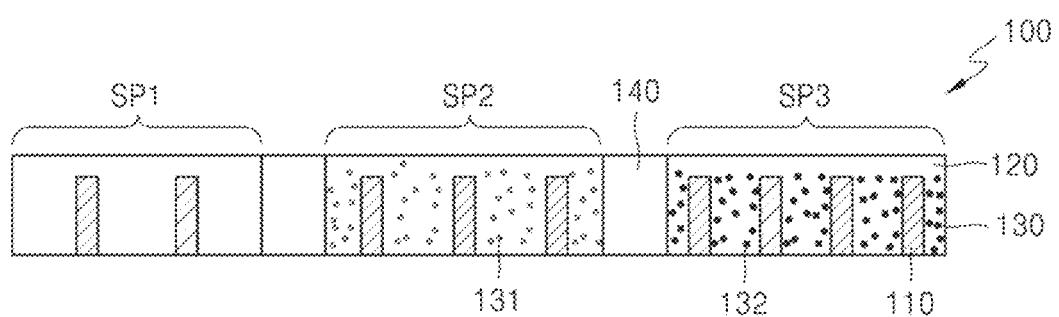
FIG. 1 is a schematic cross-sectional view of a color transformation filter according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a color transformation filter according to various example embodiments and a display device including the color transformation filter will be described in detail with reference to the accompanying drawings. In the drawings, like reference numerals denote like elements, and sizes of components may be exaggerated for clarity and convenience of explanation. While such terms as "first," "second," etc., may be used to describe various components, such components must not be limited to the above terms. The above terms are used only to distinguish one component from another.

An expression used in the singular encompasses the expression of the plural, unless it has a clearly different meaning in the context. When a portion "includes" an element, another element may be further included, rather than excluding the existence of the other element, unless otherwise described. Sizes or thicknesses of components in the drawings may be arbitrarily exaggerated for convenience of explanation. Further, when a certain material layer is described as being arranged on a substrate or another layer, the material layer may be in contact with the other layer, or there may be a third layer between the material layer and the other layer. In embodiments, materials constituting each layer are provided merely as an example, and other materials may also be used.

In addition, the terms " . . . part," "module," etc., described in the specification refer to a unit for processing at least one function or operation, which can be implemented by a hardware or a software, or a combination of a hardware and a software.

The particular implementations shown and described herein are illustrative examples of embodiments and are not intended to otherwise limit the scope of embodiments in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a" and "an" and "the" and similar referents are to be construed to cover both the singular and the plural.

Also, the steps of all methods described herein can be performed in any suitable order unless otherwise indicated herein or otherwise clearly contradicted by context. The use of any and all exemplary languages (e.g., "such as") provided herein, are intended merely to better illuminate the technical ideas and does not pose a limitation on the scope of rights unless otherwise claimed.

FIG. 1 is a diagram of a color transformation filter according to an example embodiment.

With reference to FIG. 1, a color transformation filter 100 may include a plurality of nanostructures 110 spaced apart from each other in a subpixel, a low refractive index layer 120 provided adjacent to and surrounding the nanostructures 110, and a color transformation element 130 included in the low refractive index layer 120.

FIG. 1 illustrates an example pixel, and each pixel may include a plurality of subpixels. For example, a plurality of subpixels may include a first subpixel SP1, a second subpixel SP2, and a third subpixel SP3. The subpixel may represent a region in which light of different color or wavelength is output. A partition wall 140 may be provided between the first subpixel SP1, the second subpixel SP2, and the third subpixel SP3. The partition wall 140 may prevent mixing of light from adjacent subpixels. The nanostructures 110 may include a material having a first refractive index, and the low refractive index layer 120 may include a material having a second refractive index less than the first refractive index.

The nanostructures 110 may include an oxide or a semiconductor material. The nanostructures 110 may include, for example, at least one of titanium oxide ($TiO_2$), hafnium oxide ($HfO_2$), barium titanate ($BaTiO_3$), and chromium oxide ($Cr_2O_3$). The nanostructures 110 may include at least one of silicon (Si), zinc sulfide (ZnS), zinc selenide (ZnSe), gallium phosphide (GaP), indium phosphide (InP), gallium arsenide (GaAs), gallium nitride (GaN), and aluminum arsenide ($AlAs_2$). The low refractive index layer 120 may include silicon oxide ($SiO_2$), acrylic, or curable epoxy resin.

The nanostructures 110 may be arranged to have different arrangement structures in each of the first subpixel SP1, the second subpixel SP2, and the third subpixel SP3. A wavelength band, a full width of half maximum, etc. of output light may be controlled according to an arrangement structure of the nanostructures 110. A full width of half maximum of each color light in the first subpixel SP1, the second subpixel SP2, and the third subpixel SP3 may be determined by a critical dimension of a nanostructure 110, a height of the nanostructure 110, a distance between adjacent nanostructures 110, and a width of the nanostructure 110. Each of a thickness, width, and distance of the nanostructure 110 may be less than a wavelength of color light corresponding to each subpixel. The nanostructure 110 may be arranged in a two-dimensional manner, and may be arranged in a single-layer structure or a multi-layer structure. FIG. 1 illustrates an example in which the nanostructure 110 is provided below the low refractive index layer 120. For example, a lower surface of the nanostructure 110 and a lower surface of the low refractive index layer 120 may be located on the same plane. Further, an upper surface of the nanostructure 110 may be spaced apart from an upper surface of the low refractive index layer 120.

The nanostructures 110 may be configured to output color light having a full width of half maximum less than or equal to 15 nm. The nanostructures 110 may output light of a specific wavelength of incident light according to the arrangement structure of the nanostructure and the size of the nanostructure. Further, light intensity may be enhanced by reducing a full width of half maximum of output light.

The color transformation element 130 may transform colors of light by using incident light. The color transformation element 130 may include, for example, at least one of a quantum dot and a fluorescent body.

A quantum dot, i.e., a nanometer-sized inorganic substance, has an energy bandgap of a specific wavelength, and thus is able to output light of different wavelengths when it has absorbed light having a higher energy than the energy bandgap. As the quantum dot has a narrow light emitting wavelength band, color reproduction of a display may be increased. The quantum dot may have a core-shell structure including a core portion and a shell portion, or a particle structure without a shell. The core-shell structure may include a single-shell structure and a multi-shell structure (e.g., a double-shell structure).

The quantum dots may include II-VI group semiconductors, III-V group semiconductors, IV-VI group semiconductors, IV group semiconductors and/or graphene quantum dots. The quantum dot may include, for example, cadmium (Cd), selenium (Se), zinc (Zn), sulfur (S), and/or InP, and each quantum dot may have a diameter less than or equal to tens of nanometers, for example, less than or equal to about 10 nm. The quantum dot may be excited by blue light according to its size or material, etc., and emit green light or red light.

The fluorescent body may be excited by, for example, blue light, and emit red light or green light.

The first subpixel SP1 may emit blue light, the second subpixel SP2 may emit green light, and the third subpixel SP3 may emit red light. The first subpixel SP1 may not include a color transformation element. The second subpixel SP2 may include the color transformation element 130 configured to transform incident light to green light, and the third subpixel SP3 may include the color transformation element 130 configured to transform incident light to red light.

Figure 2:
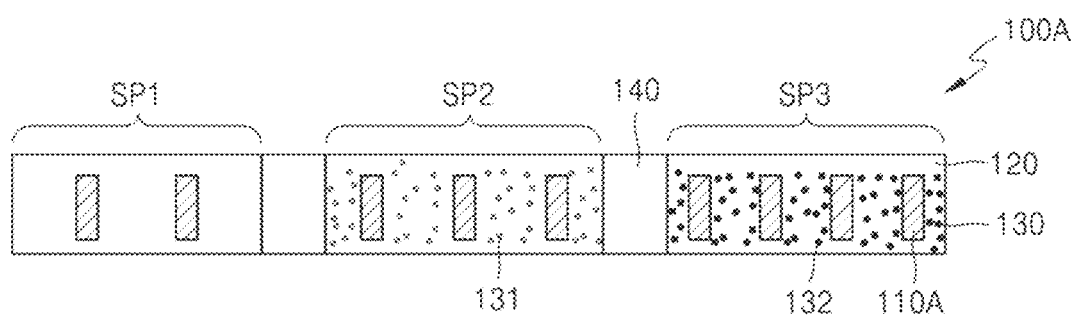
FIG. 2 is a diagram illustrating an example of a changed arrangement of nanostructures in the color transformation filter of FIG. 1.

FIG. 2 is a diagram of an example of a modified color transformation filter illustrated in FIG. 1 according to an example embodiment.

In FIG. 2, the components denoted by the same reference numerals as in FIG. 1 substantially have been described with reference to FIG. 1, and thus any redundant description is omitted. A color transformation filter 100A may include nanostructures 110A in the low refractive index layer 120. The low refractive index layer 120 may be arranged to surround a lower surface, a lateral surface, and an upper surface of the nanostructure 110A. For example, a plurality of nanostructures 110A may be buried and included in the low refractive index layer 120. The nanostructures 110A may be arranged on the same plane in the horizontal direction as the low refractive index layer 120.

Figure 3:
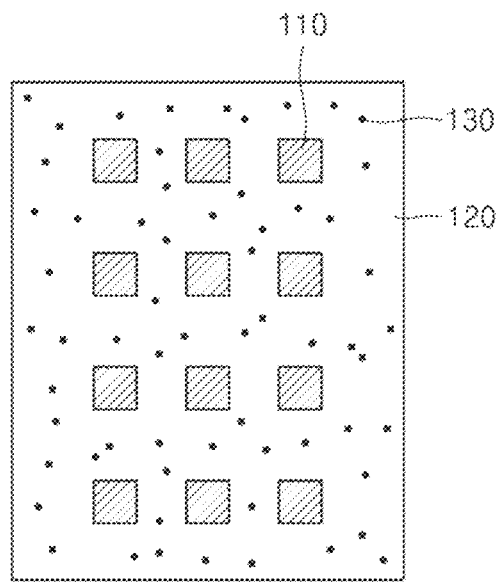
FIGS. 3 and 4 are diagrams of nanostructures of a color transformation filter according to an example embodiment.
Figure 4:
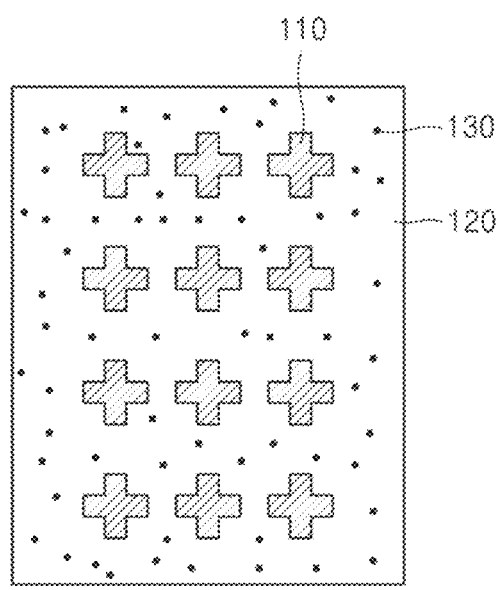

FIGS. 3 and 4 are plan views illustrating examples of shapes of nanostructures. As shown in FIG. 3, each of the nanostructures 110 may have a shape of rectangular column, or as shown in FIG. 4, each of the nanostructures 110 may have a shape of cross column. However, embodiments are not limited thereto, and each of the nanostructures 110 may have, for example, a shape of elliptical or polygonal (pentagonal or more) column, or may be constituted by combinations thereof. The filtering characteristics may be changed according to a shape of the nanostructures 110.

Figure 5:
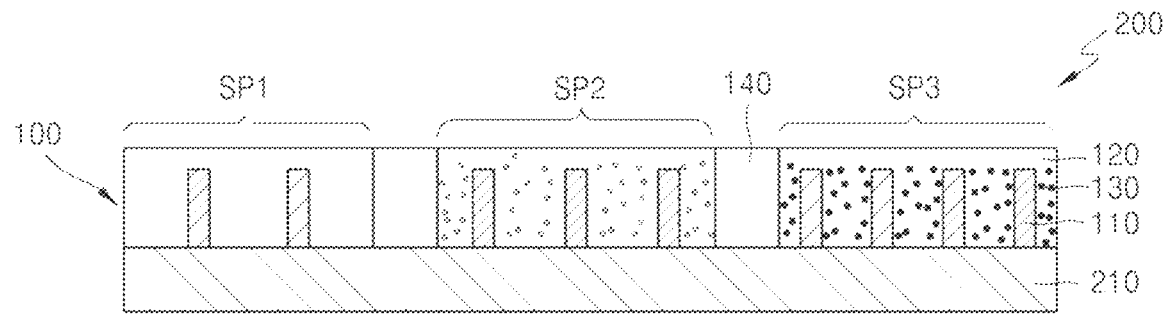
FIG. 5 is a schematic cross-sectional view of a display device according to an example embodiment.

FIG. 5 is a diagram of a display device according to an example embodiment.

A display device 200 may include a light source 210 and a color transformation filter 100 configured to output color light corresponding to each of subpixels by using light radiated from the light source 210. The display device 200 may include a plurality of pixels, and each pixel may include a plurality of subpixels. The pixel may be the smallest unit to implement colors for displaying an image, and the subpixel may be the basic unit required for displaying colors. FIG. 5 illustrates one pixel, and the pixel may include a first subpixel SP1, a second subpixel SP2, and a third subpixel SP3.

The light source 210 may radiate light to the color transformation filter 100, and may include an organic light emitting device or an inorganic light emitting device. The light source 210 may include, for example, a white light source, a blue light source, or a combined light source of a blue light source and a green light source. In addition, the light source 210 may be configured to adjust light intensity of each subpixel. The color transformation filter 100 is substantially the same as the color transformation filter described above with reference to FIG. 1, and thus redundant descriptions thereon are omitted.

The light radiated from the light source 210 may be provided to each subpixel, and by the color transformation filter 100, corresponding color light may be output from each subpixel. For example, the first subpixel SP1 may emit blue light, the second subpixel SP2 may emit green light, and the third subpixel SP3 may emit red light.

Figure 6:
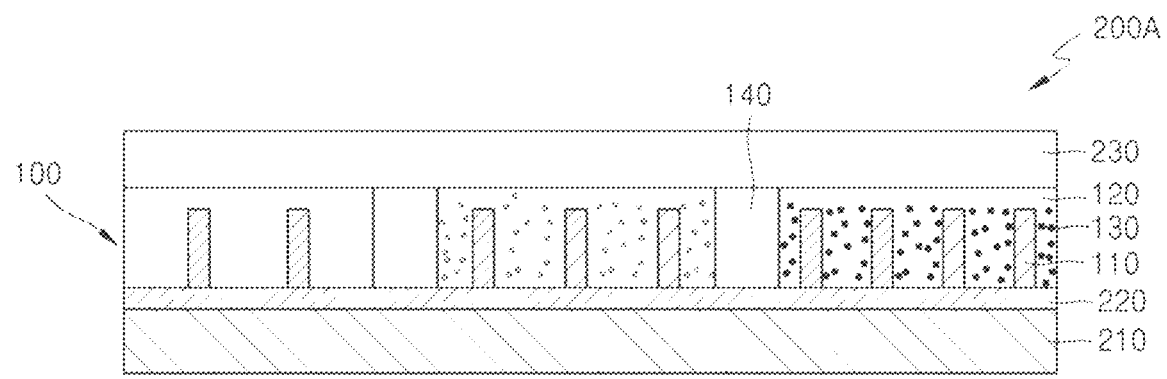
FIGS. 6, 7, 8, and 9 are diagrams illustrating various examples of a display device according to example embodiments.

FIG. 6 illustrates an example in which a spacer layer and a protective layer are further provided in the display device of FIG. 5. A display device 200A may include a spacer layer 220 arranged between the light source 210 and the color transformation filter 100. The spacer layer 220 may function as a planarization layer on the light source 210. The spacer layer 220 may include, for example, silicon oxide ($SiO_2$), silicon nitride (SiN), or gallium nitride (GaN). According to another example embodiment, the spacer layer 220 may be formed of the same material as the low refractive index layer 120. However, the material of the spacer layer 220 is not limited thereto. Further, by the spacer layer 220, the color transformation filter 100 and the light source 210 may be spaced apart from each other so that they may not be directly in contact with each other. When the color transformation element 130 is arranged too close to the light source 210, the color transformation efficiency may decrease. Accordingly, by keeping a distance between the light source 210 and the color transformation element 130 by the spacer layer 220, the color transformation efficiency may be increased.

A protective layer 230 to protect the color transformation filter 100 may be further provided above the color transformation filter 100 opposite to the light source 210. The protective layer 230 may include a material which transmits light. The protective layer 230 may include, for example, $Al_2O_3$, $SiO_2$, or SiN.

The light source may include a single color light source, or may include a multi-color light source. The single color light source may include a blue light source.

Figure 7:
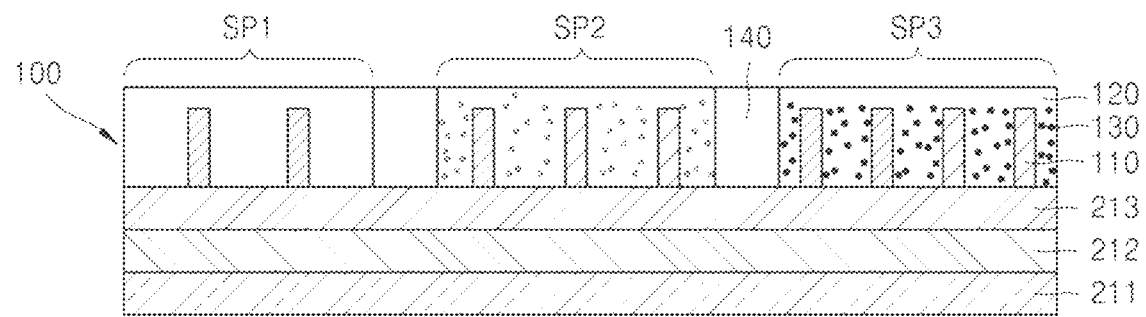
Figure 8:
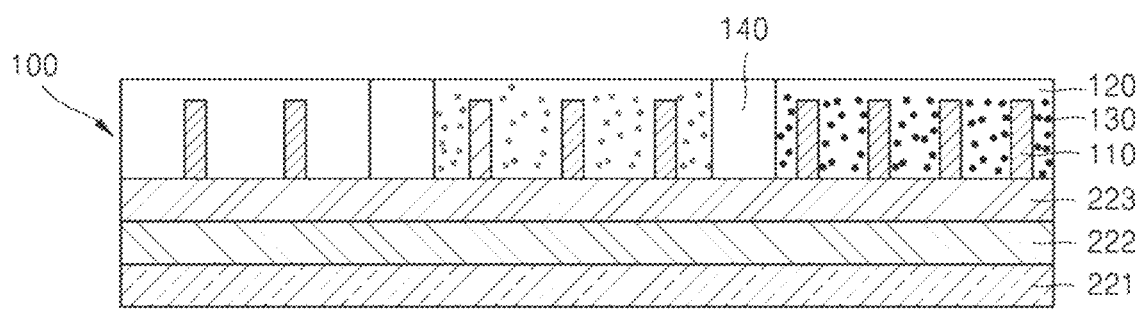

FIG. 7 illustrates an example in which a light source includes a combination of a blue light source and a green light source. The light source may include a first light source 211 emitting blue light, a second light source 212 emitting green light, and a third light source 213 emitting blue light. In FIG. 7, the first subpixel SP1 may be a blue subpixel, the second subpixel SP2 may be a green subpixel, and the third subpixel SP3 may be a red subpixel. The color transformation element 130 of the second subpixel SP2 may be excited by blue light and emit green light. Then, the green light from the second light source 212 may pass through the second subpixel SP2. In this example embodiment, the color transformation element 130 may not be provided in the second subpixel SP2. The color transformation element 130 of the third subpixel SP3 may be excited by blue light and emit red light. In FIG. 8, the light source is a white light source, and includes a first light source 221 emitting red light, a second light source 222 emitting green light, and a third light source 223 emitting blue light. In FIGS. 7 and 8, the first light source 211 and 221, the second light source 212 and 222, and the third light source 213 and 223 may include an organic light emitting device or an inorganic light emitting device. In FIG. 8, the first subpixel SP1 may be a blue subpixel, the second subpixel SP2 may be a green subpixel, and the third subpixel SP3 may be a red subpixel. The color transformation element 130 of the second subpixel SP2 may be excited by blue light and emit green light. Then, the green light from the second light source 212 may pass through the second subpixel SP2. The color transformation element 130 of the third subpixel SP3 may be excited by blue light and emit red light. Then, the red light from the first light source 221 may pass through the third subpixel SP3. In this example embodiment, the color transformation element 130 may not be provided in the second subpixel SP2 and the third subpixel SP3. Hereinafter, a case in which the light source includes an organic light emitting device is described.

Figure 9:
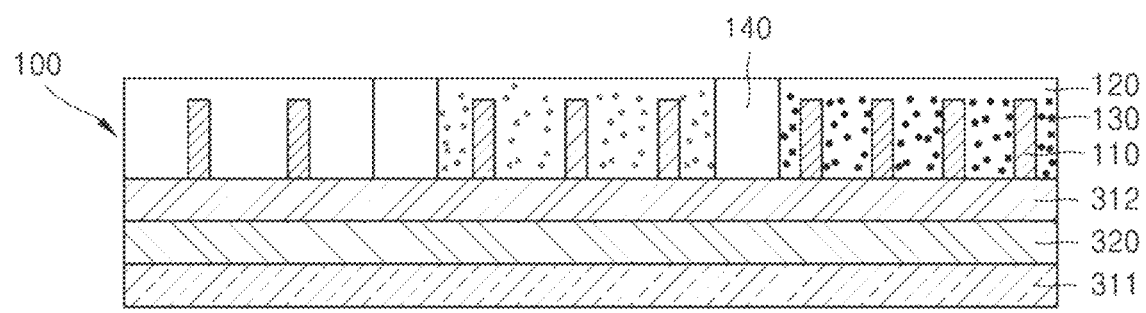

With reference to FIG. 9, the light source may include a first electrode 311, an organic light emitting layer 320 provided on the first electrode 311, and a second electrode 312 provided on the organic light emitting layer 320. When a voltage is applied to the first electrode 311 and the second electrode 312, a hole and an electron may be coupled in the organic light emitting layer 320, thereby generating light. According to a material of the organic light emitting layer 320, blue light, green light, red light, etc. may be generated.

Figure 10:
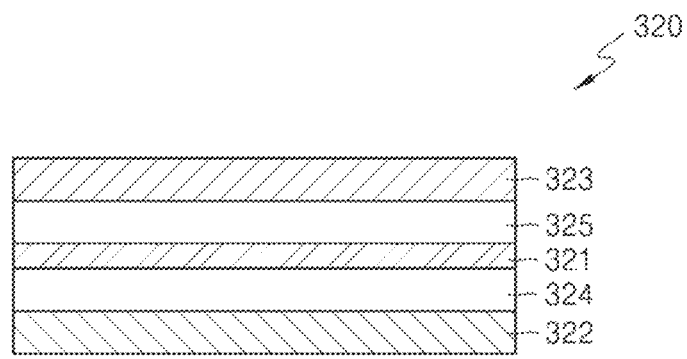
FIGS. 10 and 11 illustrate specific examples of an organic light emitting layer of the display device of FIG. 9.

FIG. 10 is a detailed cross-sectional view of an example of a structure of the organic light emitting layer 320 of FIG. 9. With reference to FIG. 10, the organic light emitting layer 320 may include a hole injection layer 322 arranged on the first electrode 311, an organic light emitting material layer 321 arranged above the hole injection layer 322, and an electron injection layer 323 arranged below the organic light emitting material layer 321. In this structure, a hole provided through the hole injection layer 322 may be coupled with an electron provided through the electron injection layer 323 in the organic light emitting material layer 321 to generate light. A wavelength of generated light may be determined by an energy bandgap of a light emitting material of the organic light emitting material layer 321.

Further, to facilitate the transfer of the hole even more, the organic light emitting layer 320 may further include a hole transfer layer 324 arranged between the hole injection layer 322 and the organic light emitting material layer 321. In addition, to facilitate the transfer of the electron even more, the organic light emitting layer 320 may further include an electron transfer layer 325 arranged between the electron injection layer 323 and the organic light emitting material layer 321. In addition, the organic light emitting layer 320 may include various additional layers, if necessary. For example, the organic light emitting layer 320 may further include an electron block layer between the hole transfer layer 324 and the organic light emitting material layer 321, and may further include a hole block layer between the organic light emitting material layer 321 and the electron transfer layer 325.

The organic light emitting material layer 321 may be configured to emit visible light. For example, the organic light emitting material layer 321 may be configured to emit light of at least one of a wavelength band of red light, a wavelength band of green light, and a wavelength band of blue light. According to another example embodiment, the organic light emitting material layer 321 may be configured to emit white visible light including all of red light, green light, and blue light.

Figure 11:
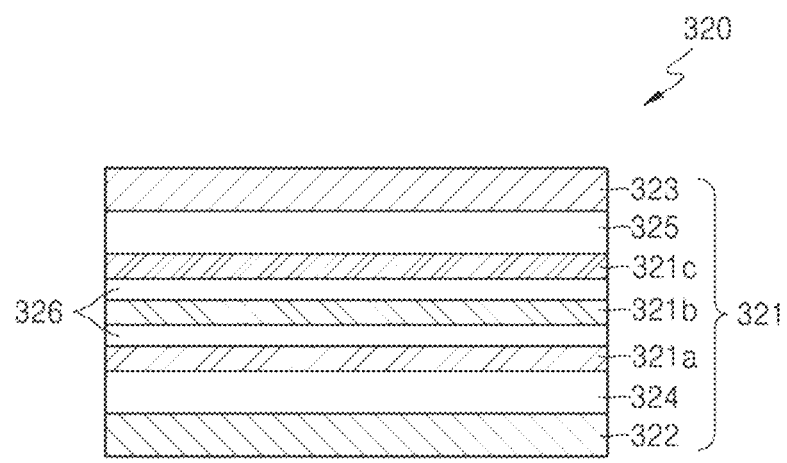

For example, FIG. 11 is a detailed cross-sectional view illustrating another example of the structure of the organic light emitting layer 320 shown in FIG. 9. With reference to FIG. 11, the organic light emitting material layer 321 may include a first organic light emitting material layer 321a emitting red light, a second organic light emitting material layer 321b emitting green light, and a third organic light emitting material layer 321c emitting blue light. Further, an exciton blocking layer 326 may be arranged between the first organic light emitting material layer 321a and the second organic light emitting material layer 321b and between the second organic light emitting material layer 321b and the third organic light emitting material layer 321c. The exciton blocking layer 326 may prevent exciton coming out from the first organic light emitting material layer 321a, the second organic light emitting material layer 321b, and the third organic light emitting material layer 321c from being moved over to other layers. The light from the first organic light emitting material layer 321a, the second organic light emitting material layer 321b, and the third organic light emitting material layer 321c may be mixed to emit white light. However, the structure of the organic light emitting layer 320 configured to emit white light is not limited thereto. Instead of including three organic light emitting material layers (i.e., the first, second, and third organic light emitting material layers 321a, 321b, and 321c), the organic light emitting layer 320 may include two organic light emitting material layers having complementary colors.

The first electrode 311 arranged on the lower surface of the organic light emitting layer 320 may function as an anode providing a hole. The second electrode 312 arranged on the upper surface of the organic light emitting layer 320 may function as a cathode providing an electron. To this end, the first electrode 311 may include a material having a relatively high work function, and the second electrode 312 may include a material having a relatively low work function.

The first electrode 311 may include a material which reflects light. The first electrode 311 may include a reflective metal. For example, the first electrode 311 may include silver (Ag), aluminum (Al), gold (Au), nickel (Ni), or alloys thereof, or include a multi-layer structure of silver (Ag) and magnesium (Mg) or a multi-layer structure of aluminum (Al) and lithium (Li).

The second electrode 312 may be a transparent electrode having a characteristic of transmitting light (e.g., visible light). For example, the second electrode 312 may include a transparent conductive oxide, such as an indium tin oxide (ITO), an indium zinc oxide (IZO), and an aluminum zinc oxide (AZO).

For example, when each of the nanostructures 110 has a cylindrical shape, a wavelength of light output from the color transformation filter 100 may be determined by a diameter of each nanostructure 110, a thickness of each nanostructure 110, a distance between the nanostructures 110, or an arrangement period of the nanostructures 110. According to another example embodiment, when each of the nanostructures 110 has a shape of polygonal column, a wavelength of light output from the color transformation filter 100 may be determined by a maximum width of each nanostructure 110, a thickness of each nanostructure 110, a distance between the nanostructures 110, or arrangement period of the nanostructures 110.

Figure 12:
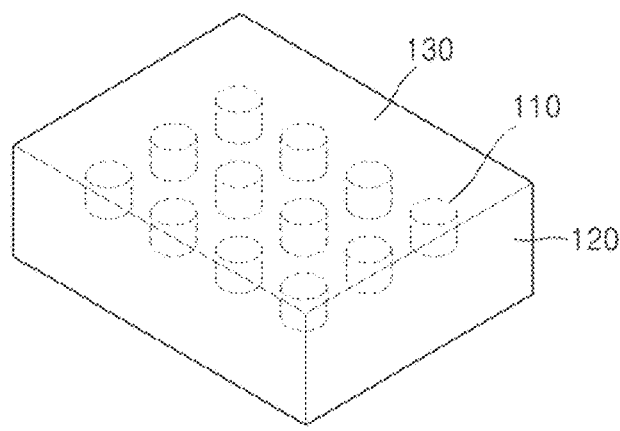
FIG. 12 is a perspective view of a color transformation filter according to an example embodiment.

FIG. 12 is a perspective view illustrating a structure in which the nanostructures 110 are regularly arranged in the low refractive index layer 120. The nanostructures 110 may have a cylindrical shape, and may be arranged in the form of a matrix. However, the arrangement structure of the nanostructures 110 is not limited thereto, and the nanostructures 110 may be arranged in a zigzag shape.

Figure 13:
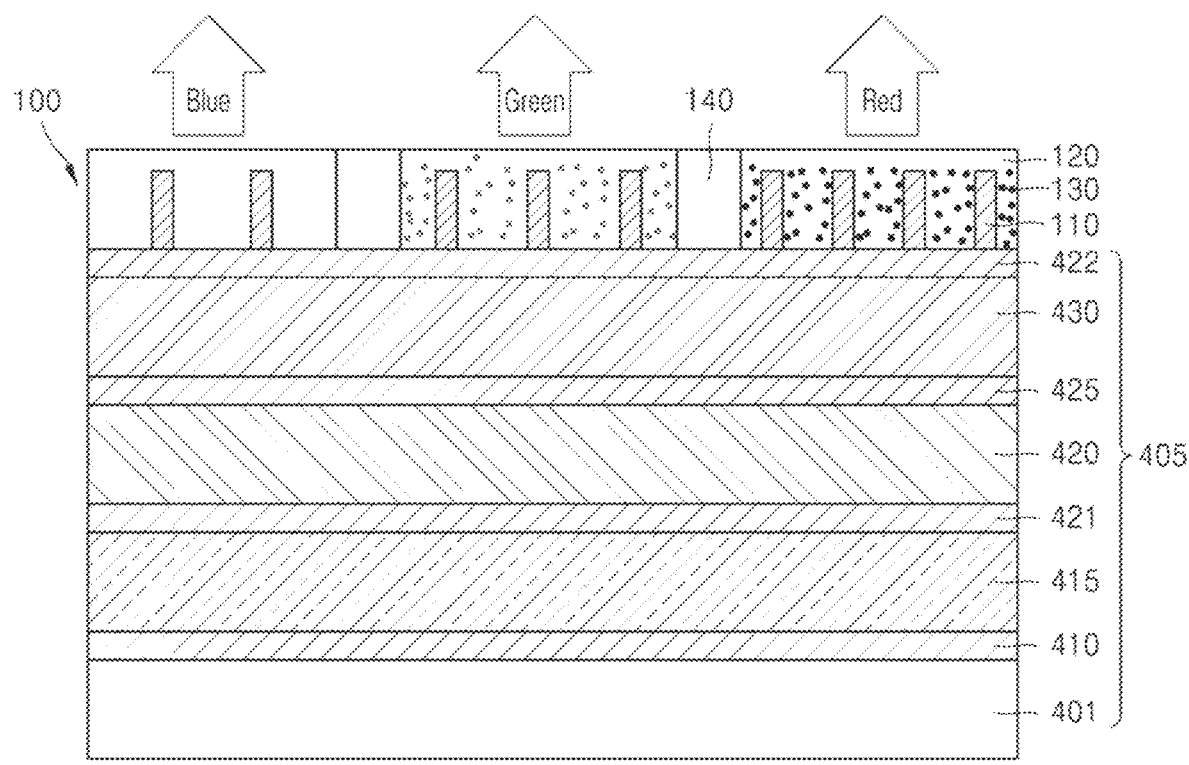
FIG. 13 is diagram of a tandem structure of a display device according to an example embodiment.

FIG. 13 is a diagram of a display device according to another example embodiment.

With reference to FIG. 13, a driving substrate 401 may be provided, and an organic light emitting source 405 may be provided on the driving substrate 401. The driving substrate 401 may include a transistor and a capacitor for driving the organic light emitting source 405. The driving substrate 401 may be a thin film transistor (TFT) array substrate including a plurality of TFTs. The plurality of TFTs may be a device for driving subpixels of the organic light emitting source 405. The organic light emitting source 405 may include the color transformation filter 100.

The organic light emitting source 405 may include a first electrode 410. The first electrode 410 may be a pixel electrode patterned to correspond to each subpixel. Each first electrode 410 may be electrically connected to each TFT device of the driving substrate 401. A first blue light emitting unit 415, a green light emitting unit 420, and a second blue light emitting unit 430 may be stacked in this stated order on the first electrode 410. A first charge generation layer 421 may be provided between the first blue light emitting unit 415 and the green light emitting unit 420. Further, a second charge generation layer 425 may be provided between the green light emitting unit 420 and the second blue light emitting unit 430. The first blue light emitting unit 415, the green light emitting unit 420, and the second blue light emitting unit 430 may be connected in series to constitute a tandem structure. A second electrode 422 may be provided on the second blue light emitting unit 430. The second electrode 422 may be a common electrode connected to each subpixel. Here, although the second electrode 422 is described as a common electrode, in some cases, the second electrode 422 may be a pixel electrode patterned by a plurality of electrode elements. The first electrode 410 may be a cathode, and the second electrode 422 may be an anode, or vice versa. The first electrode 410 may not be patterned when the second electrode 422 is patterned, or both of the first electrode 410 and the second electrode 422 may be patterned. In addition, a plurality of light emitting units (i.e., the first blue light emitting unit 415, the green light emitting unit 420, and the second blue light emitting unit 430) arranged between the first electrode 410 and the second electrode 422 as well as the first charge generation layer 421 and the second charge generation layer 425 therebetween may also have a structure patterned by a subpixel. The color transformation filter 100 is substantially the same as the color transformation filter described above with reference to FIGS. 1 and 2, and thus redundant descriptions thereon are omitted.

Figure 14:
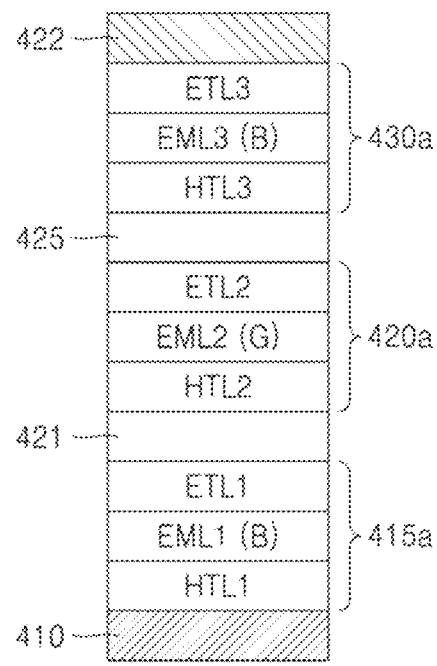
FIG. 14 illustrates a specific example of an organic light emitting unit of the display device of FIG. 13.

FIG. 14 is a cross-sectional view illustrating in detail a structure of an organic light emitting source which may be applied to a display device according to an example embodiment. FIG. 14 shows in more detail a possible structure which each organic light emitting unit of FIG. 13 may have.

With reference to FIG. 14, a first blue light emitting unit 415a, the first charge generation layer 421, a green light emitting unit 420a, the second charge generation layer 425, a second blue light emitting unit 430a, and the second electrode 422 may be provided in that order on the first electrode 410.

The first blue light emitting unit 415a may include a first blue light emitting layer EML1 including an organic matter-based blue light emitting material, and may further include a first hole transfer layer HTL1 and a first electron transfer layer ETL1. The first hole transfer layer HTL1 may be arranged between the first blue light emitting layer EML1 and the first electrode 410, and the first electron transfer layer ETL1 may be arranged between the first blue light emitting layer EML1 and the first charge generation layer 421. The green light emitting unit 420a may include a green light emitting layer EML2 including an organic matter-based green light emitting material, and may further include a second hole transfer layer HTL2 and a second electron transfer layer ETL2. The second blue light emitting unit 430a may include a second blue light emitting layer EML3 including an organic matter-based blue light emitting material, and may further include a third hole transfer layer HTL3 and a third electron transfer layer ETL3. Each of the first blue light emitting unit 415a, the green light emitting unit 420a, and the second blue light emitting unit 430a may further include at least one of the hole injection layer and the electron injection layer. The first charge generation layer 421 and the second charge generation layer 425 may be formed of a metal or a metallic material, and may function to improve the light emission efficiency of the organic light emitting source 405.

Figure 15:
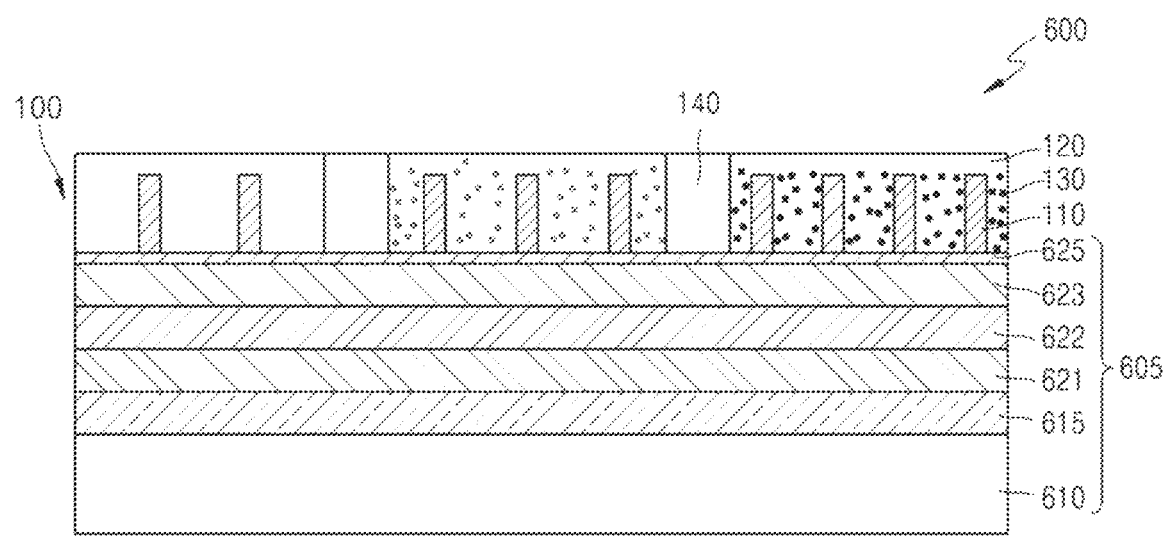
FIG. 15 illustrates an example in which a light source of a display device according to an example embodiment includes an inorganic light emitting layer.

FIG. 15 illustrates an example in which a light source includes an inorganic light emitting device according to an example embodiment.

A display device 600 may include an inorganic light emitting source 605 and the color transformation filter 100 provided in the inorganic light emitting source 605.

The inorganic light emitting source 605 may include a substrate 610, a first semiconductor layer 621 stacked on the substrate 610, a light emitting layer 622, and a second semiconductor layer 623. The first semiconductor layer 621 may include a first type semiconductor. For example, the first semiconductor layer 621 may include an n-type semiconductor or a p-type semiconductor. The first semiconductor layer 621 may include III-V group n-type semiconductors, for example, n-GaN. According to another example embodiment, the first semiconductor layer 621 may include an aluminum nitride (AlN) layer or an $Al_xGa(1-x)N(0 \leq x \leq 1)$ layer. The first semiconductor layer 621 may have a single layer structure or a multi-layer structure.

The light emitting layer 622 may be arranged on the upper surface of the first semiconductor layer 621. When an electron and a hole are coupled, the light emitting layer 622 may generate light. The light emitting layer 622 may have a multi-quantum well (MQW) structure, or a single-quantum well (SQW) structure. The light emitting layer 622 may include III-V group semiconductors, for example, GaN. The light emitting layer 622 may have a MQW structure in which an indium gallium nitride (InGaN) layer and a GaN layer are stacked alternately.

The second semiconductor layer 623 may include a second type semiconductor. For example, the second semiconductor layer 623 may include a p-type semiconductor layer. When the first semiconductor layer 621 is n type, the second semiconductor layer 623 may be p type. The second semiconductor layer 623 may include, for example, a GaN layer, an AlN layer, or an $Al_xGa(1-x)N(0 \leq x \leq 1)$ layer. For example, as a p-type dopant, magnesium (Mg), calcium (Ca), zinc (Zn), cadmium (Cd), mercury (Hg), etc. may be used. The inorganic light emitting source 605 may be a micro light emitting device. A first electrode 615 may be provided between the substrate 610 and the first semiconductor layer 621, and a second electrode 625 may be provided between the second semiconductor layer 623 and the color transformation filter 100. When a voltage is applied to the first electrode 615 and the second electrode 625, an electron and a hole provided from the first semiconductor layer 621 and the second semiconductor layer 623 may be coupled and light of a specific wavelength may be emitted. The light emitting layer 622 may emit, for example, blue light. When the light emitted from the light emitting layer 622 is incident on the color transformation filter 100, blue light may be output from the first subpixel SP1, green light may be output from the second subpixel SP2, and red light may be output from the third subpixel SP3. Blue light having a narrow full width of half maximum may be output from the first subpixel SP1 by the nanostructures 110, green light having a narrow full width of half maximum may be output from the second subpixel SP2, and red light having a narrow full width of half maximum may be output from the third subpixel SP3.

Figure 16:
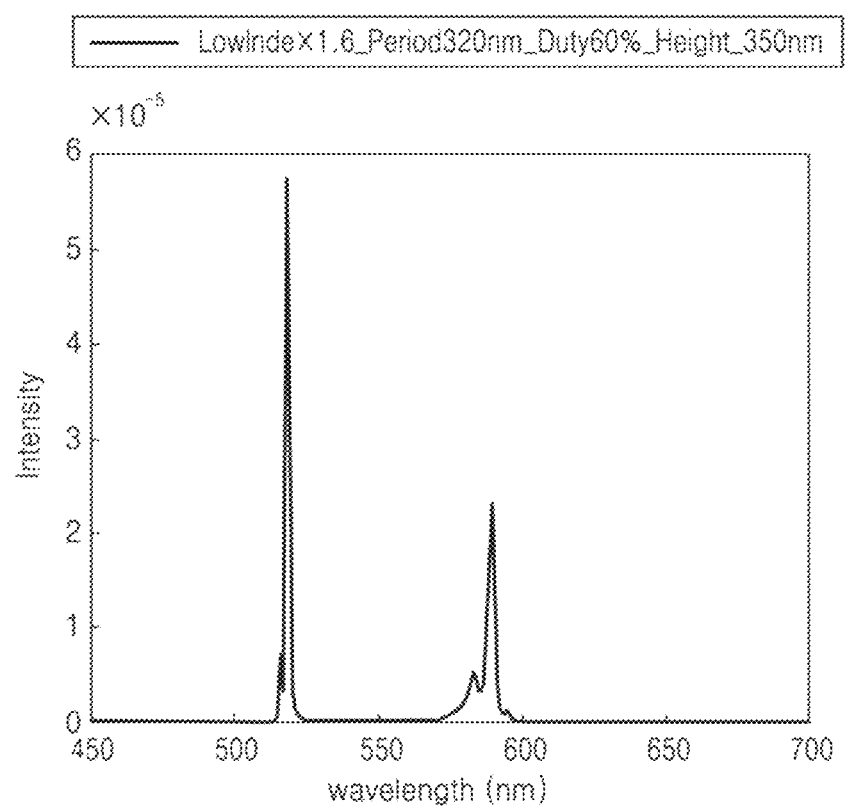
FIG. 16 shows light intensities according to wavelengths of light output through a color transformation filter having green as a target wavelength according to an example embodiment.

FIG. 16 shows light intensities according to wavelengths of light output through a color transformation filter having green as a target wavelength according to an example embodiment. The low refractive index layer includes $SiO_2$, the nanostructure includes $TiO_2$, the arrangement period of the nanostructure is 320 nm, the height is 350 nm, and the width of the nanostructure is 60% of the duty cycle. The refractive index is assumed as 1.6 under the presumption that a quantum dot with a high refractive index is mixed with the low refractive index layer, and a dipole source of white light is arranged at the position of the quantum dot to perform a far field spectrum calculation of light emitted to the outside of the color transformation filter. The light from an upper part of the color transformation filter may spread out in the form of semi-sphere. The far field projection may represent, for example, a result obtained from calculating and projecting an emission amount at a position one meter away from the color transformation filter. The light from above the color transformation filter may have range from −90 degrees to +90 degrees, and as both directions are symmetrical, a half angle may have a range from 0 degree to 90 degrees. For example, an integral value in the five-degree range of the half angle may represent a value obtained from integrating an emission amount at a viewing angle within ten degrees (from −5 degrees to +5 degrees) in a normal direction at a far field.

The spectrum of light integrated at a five-degree half angle of the far field projection may be as described below. Considering that a full width of half maximum of a target wavelength (green) is less than or equal to 1 nm, and a full width of half maximum of light emitting spectrum of ordinary quantum dot is less than or equal to 30 nm, the color transformation filter according to an example embodiment may have a relatively high color purity. Further, as remaining light after absorption of transmitted blue light into the quantum dot is not emitted to the surface of the color transformation filter, the color reproduction may be improved effectively. Accordingly, no additional optical filter is needed, and a thick color filter having a thickness of tens of micrometers is not required for optical absorption.

Figure 17:
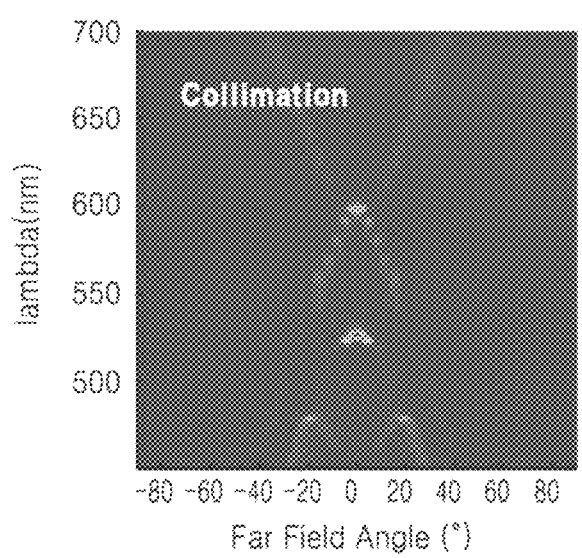
FIG. 17 shows a spectrum according to a far field angle of light emitted from a color transformation filter according to an example embodiment.

FIG. 17 shows a spectrum according to a far field angle of light emitted from a color transformation filter according to an example embodiment. The green wavelength (the target wavelength) has the characteristic of directional emission, i.e., emission within five degrees in the vertical direction of the color transformation filter. By using such characteristic of directional emission, the color transformation filter may be applied to a display, such as augmented reality (AR) glasses, virtual reality (VR) glasses, etc.

Figure 18:
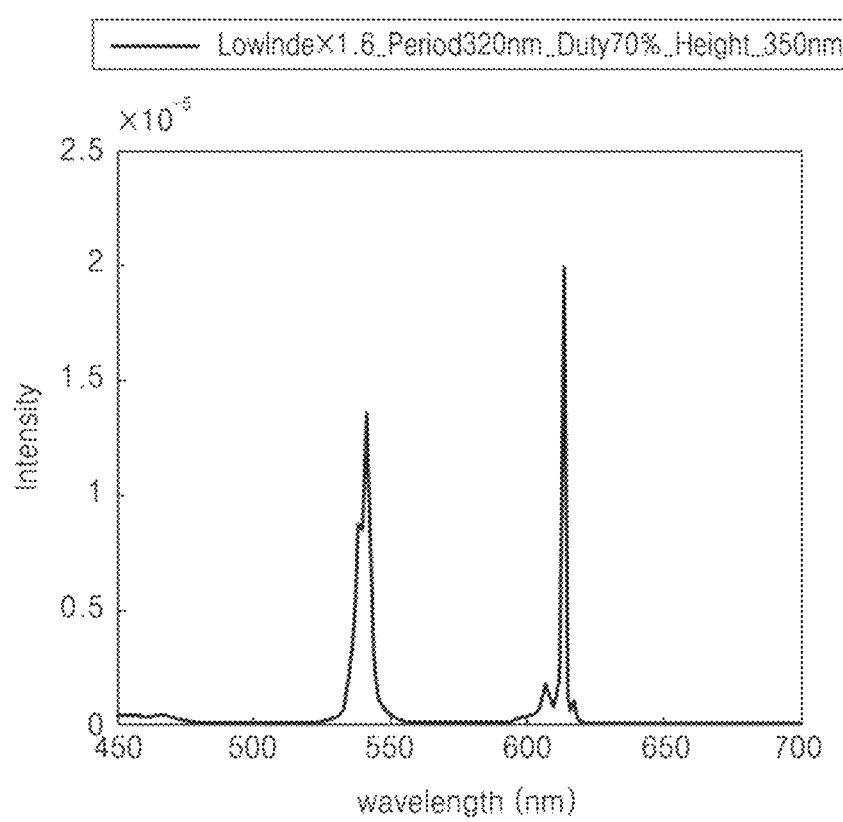
FIG. 18 shows light intensities according to wavelengths of light output through a color transformation filter having red as a target wavelength according to an example embodiment.

FIG. 18 shows light intensities according to wavelengths of light output through a color transformation filter having red as a target wavelength according to an example embodiment. The low refractive index layer includes $SiO_2$, the nanostructure includes $TiO_2$, the arrangement period of the nanostructure is 320 nm, the height is 350 nm, and the width of the nanostructure is 70% of the duty cycle. The other conditions are the same as those described with reference to FIG. 16. With reference to FIG. 18, a full width of half maximum of red wavelength (target wavelength) is less than or equal to about 3 nm.

Figure 19:
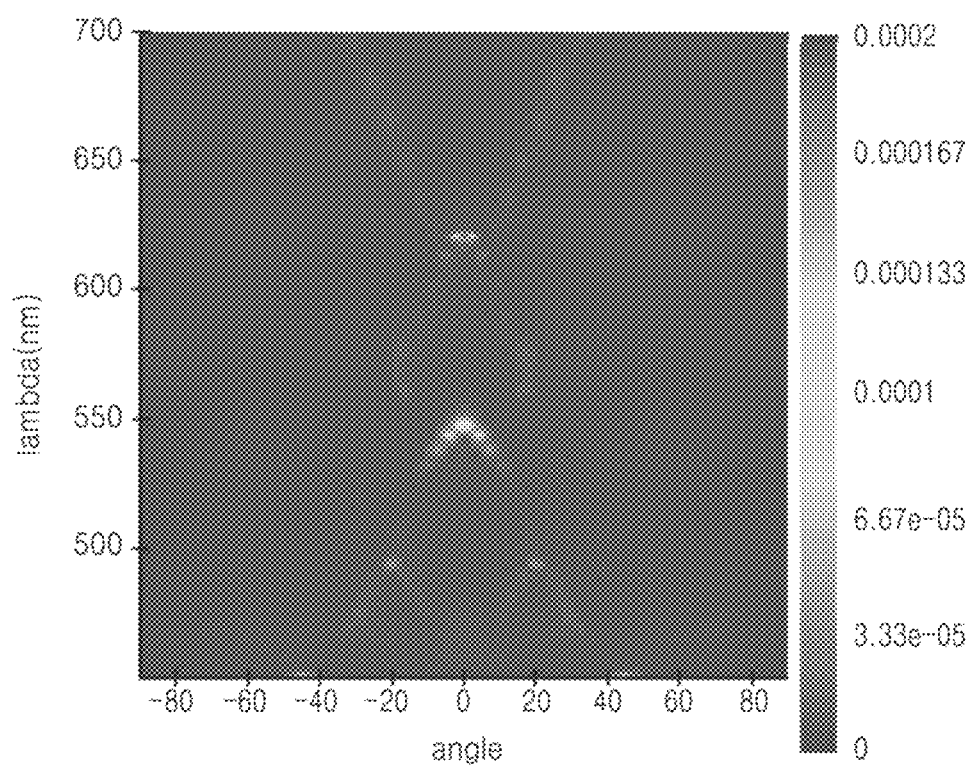
FIG. 19 shows a spectrum according to a far field angle of light emitted from a color transformation filter according to an example embodiment.

FIG. 19 shows a spectrum according to a far field angle of light emitted from a color transformation filter according to an embodiment. A viewing angle in the far field is within about five degrees in the vertical direction of the color transformation filter.

Figure 20:
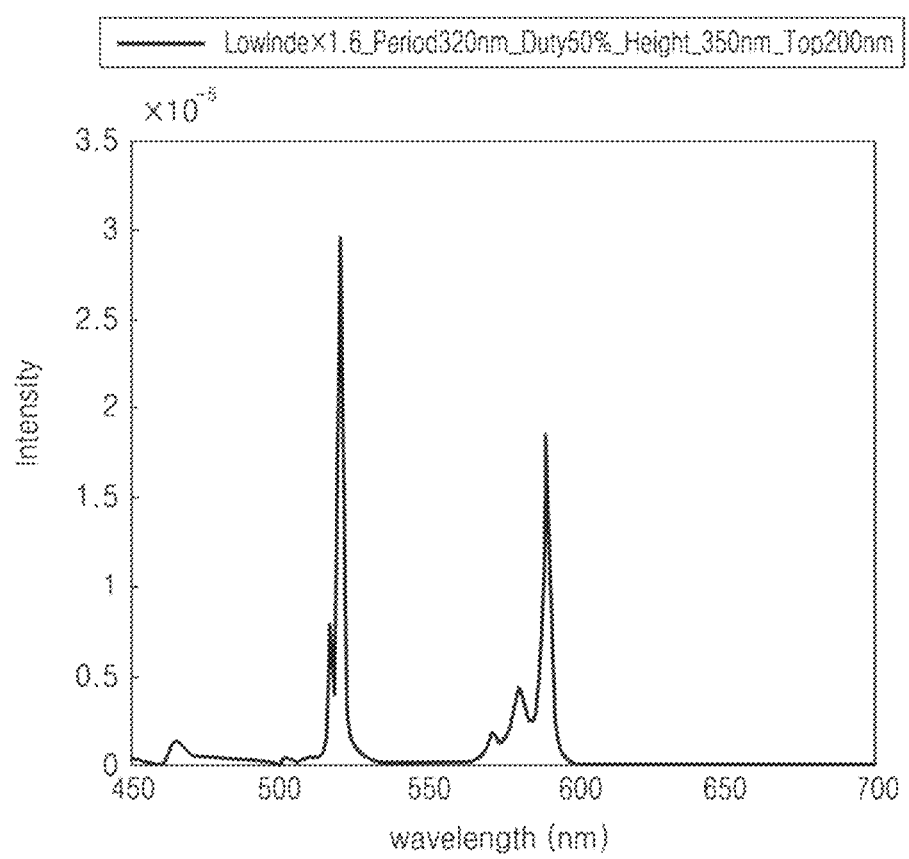
FIG. 20 shows light intensities according to wavelengths of a color transformation filter according to another example embodiment.

FIG. 20 shows light intensities according to wavelengths of a color transformation filter according to another example embodiment. In this case, a quantum dot layer of 200 nm is additionally provided on the color transformation filter having the period of nanostructure of $TiO_2$ of 320 nm, duty cycle of 50%, and height of 350 nm. A light emitting spectrum of high color purity having a full width of half maximum less than or equal to 1 nm also appears.

Figure 21:
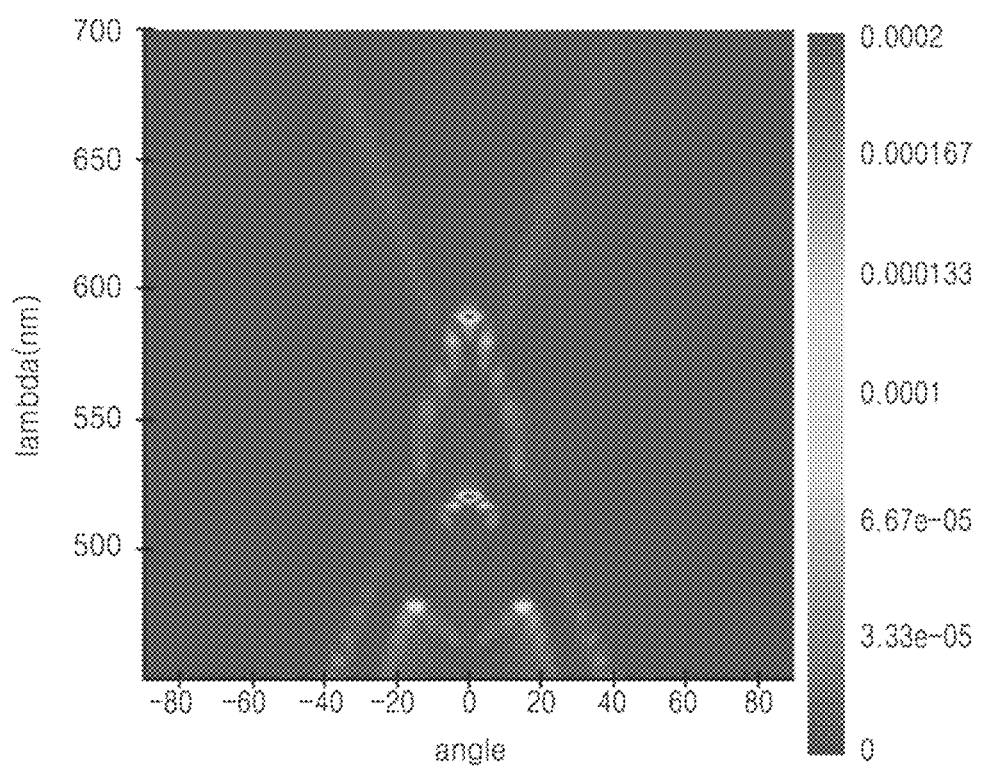
FIG. 21 shows a spectrum according to a far field angle of light emitted from a color transformation filter according to an example embodiment.

FIG. 21 shows a spectrum according to a far field angle of light emitted from a color transformation filter according to an embodiment. A viewing angle of green light in the far field is within about five degrees in the vertical direction of the color transformation filter.

Figure 22:
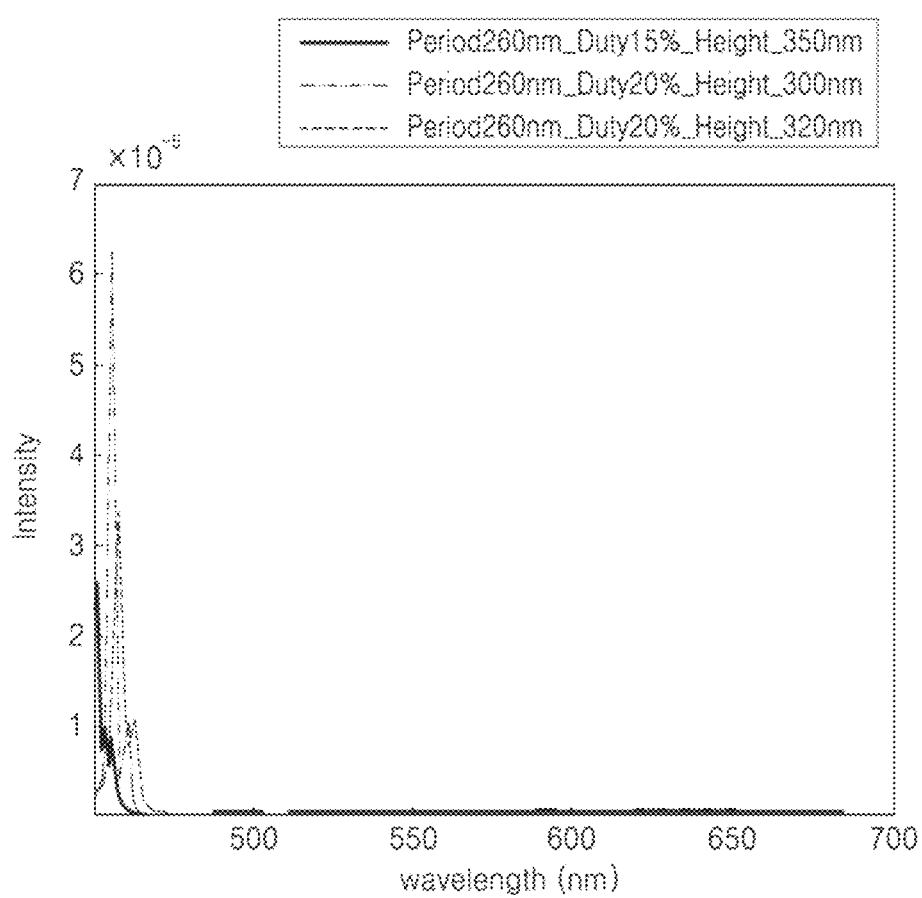
FIG. 22 shows light intensities according to wavelengths in the case of a subpixel including a nanostructure without a color transformation element.

FIG. 22 shows light intensities according to wavelengths in the case of a first subpixel SP1 of FIG. 5 including a nanostructure without a color transformation element. When the period of the nanostructure is 260 nm, the duty cycle is 15%, and the height is 350 nm, when the period is 260 nm, the duty cycle is 20%, and the height is 300 nm, and when the period is 260 nm, the duty cycle is 20%, and the height is 320 nm, at the time of transmission of blue light without a color transformation element, light of other wavelengths are not transmitted, and only a full width of half maximum less than or equal to about 3 nm may appear with respect to the blue light.

Figure 23:
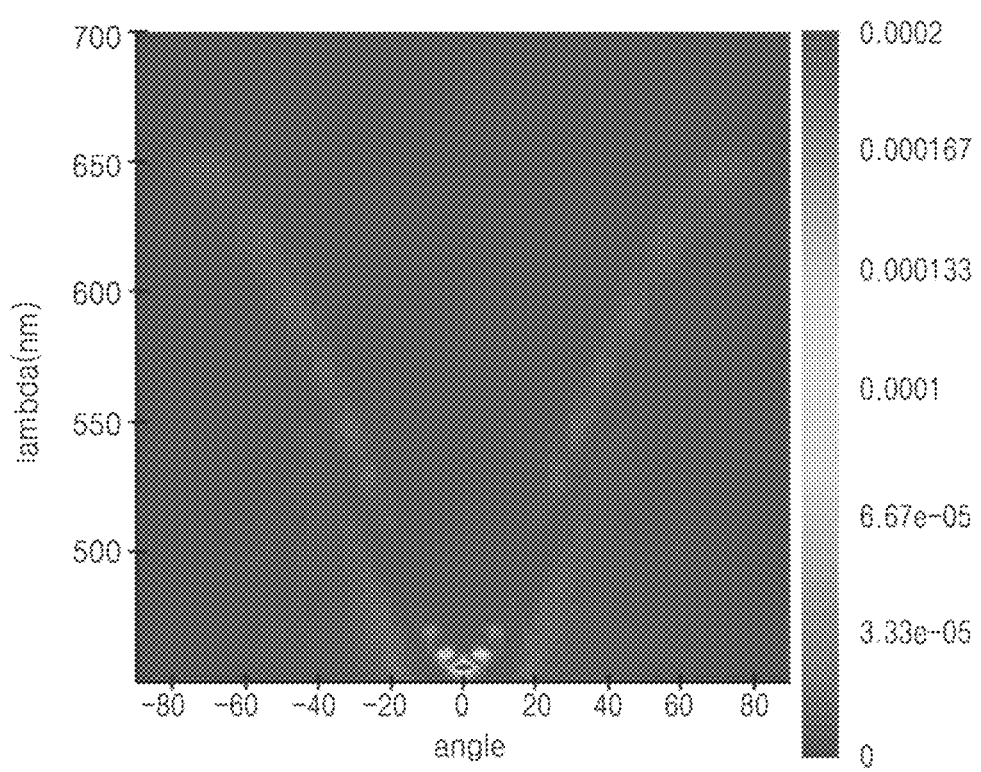
FIG. 23 shows a spectrum according to a far field angle of emitted light when a period, duty cycle, and height of a nanostructure are 260 nm, 15%, and 350 nm, respectively.

FIG. 23 shows a spectrum according to a far field angle of emitted light when a period, duty cycle, and height of a nanostructure is 260 nm, 15%, and 350 nm, respectively. A viewing angle of blue light in the far field is within about five degrees in the vertical direction of the color transformation filter.

Figure 24:
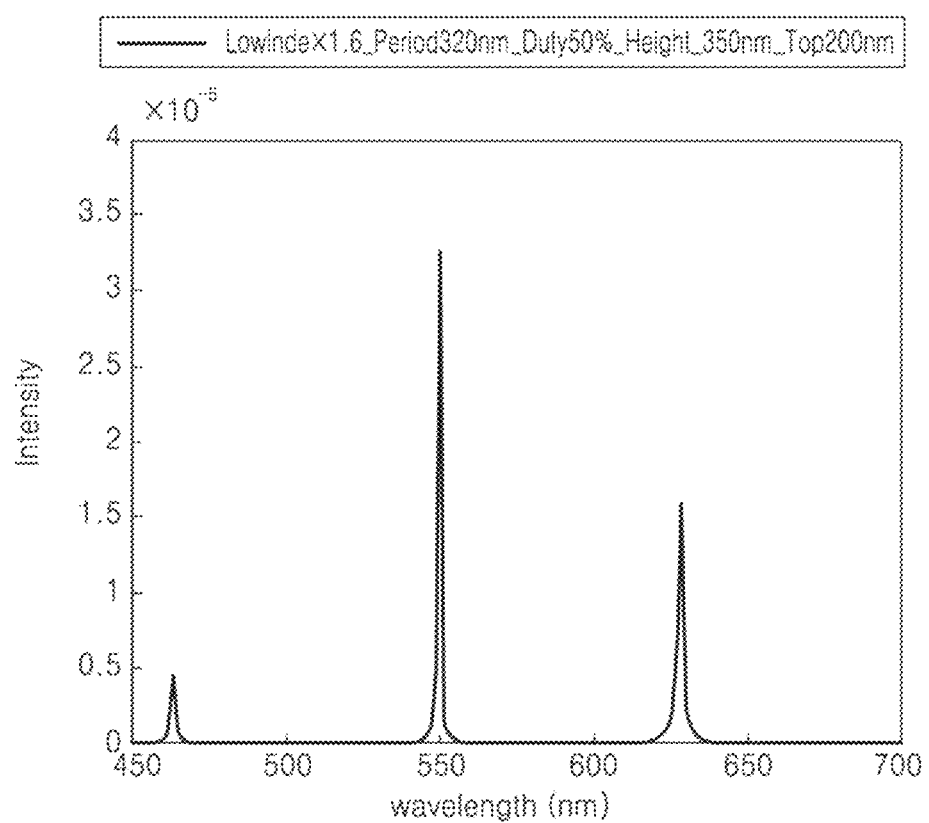
FIG. 24 shows light intensities according to wavelengths of output light of a color transformation filter including a high refractive index (4)/low refractive index (1.6) nanostructure having a period of 220 nm, a duty cycle of 70%, and a height of 250 nm.

FIG. 24 shows light intensities according to wavelengths of output light when a nanostructure including a dielectric with low optical absorption and higher refractive index than $TiO_2$ is used. In this case, a high refractive index (4)/low refractive index (1.6) nanostructure having period of 220 nm, duty cycle of 70% and height of 250 nm is included. A light emitting spectrum of high color purity having a full width of half maximum less than or equal to 1 nm also appears.

Figure 25:
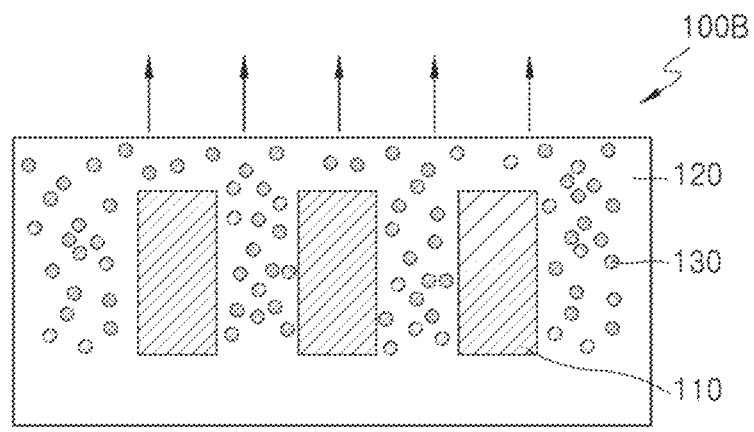
FIG. 25 is a diagram of an example of a modified color transformation filter illustrated in FIG. 2.

FIG. 25 is a diagram of an example of a modified color transformation filter illustrated in FIG. 2 according to another example embodiment.

A color transformation filter 100B may include the low refractive index layer 120, the nanostructures 110 buried in the low refractive index layer 120, and the color transformation element 130 distributed in the low refractive index layer 120. The color transformation element 130 may be distributed relatively more in the upper portion of the low refractive index layer 120 than in the lower portion. For example, the color transformation element 130 may not be provided below the nanostructures 110, and may be provided above the nanostructures 110 and in the lateral direction of the nanostructures 110. According to another example embodiment, the color transformation element 130 may be distributed most above the nanostructures 110 among above, below, and beside the nanostructures 110. Although the nanostructures 110 are buried in the low refractive index layer 120 in FIG. 25, even when the nanostructures 110 are provided below the low refractive index layer 120, the color transformation element 130 may be distributed relatively more in the upper portion of the low refractive index layer 120 than in the lower portion. As such, by distributing more color transformation element 130 at a greater distance from the light source 210 (see FIG. 4), not only the reactivity between the light source 210 and the color transformation element 130 may be increased, but also the efficiency and color purity may be improved.

Figure 26:
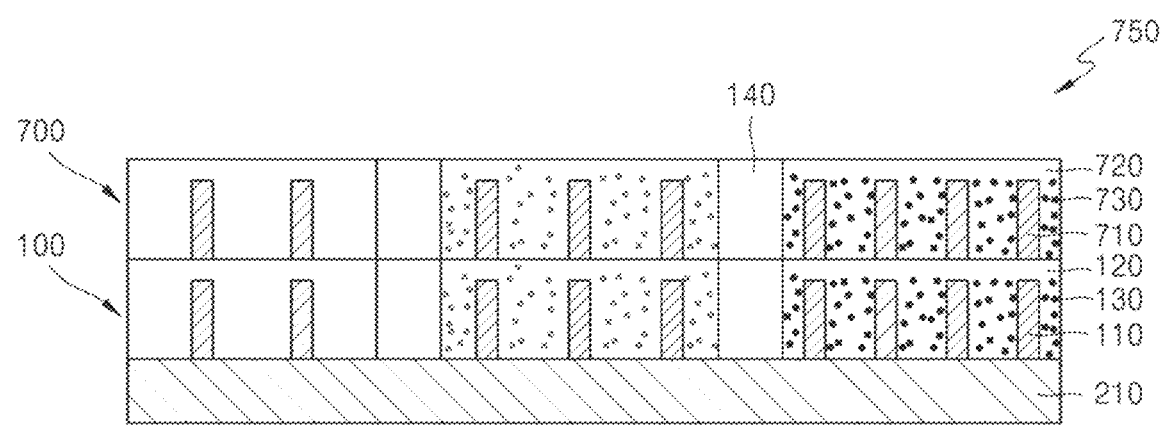
FIG. 26 is a diagram of a display device according to another example embodiment.

FIG. 26 is a diagram of a display device according to another example embodiment.

A display device 750 may include a multi-layer color transformation filter. The display device 750 may include the light source 210, a first color transformation filter 100 provided in the light source 210, and a second color transformation filter 700. The light source described with reference to FIGS. 5 to 15 may be applied as the light source 210. The first color transformation filter 100 is the same as the color transformation filter described above with reference to FIGS. 1 and 2, and thus redundant descriptions thereon are omitted. The second color transformation filter 700 may include a low refractive index layer 720, nanostructures 710 spaced apart from each other in the low refractive index layer 720, and a color transformation element 730 arranged in the low refractive index layer 720. The nanostructures 710, the low refractive index layer 720, and the color transformation element 730 are substantially the same as the nanostructures 110, the low refractive index layer 120, and the color transformation element 130 described above with reference to FIGS. 1 and 2, respectively, and thus redundant descriptions thereon are omitted. Here, the nanostructures 110 of the first color transformation filter 100 and the nanostructures 710 of the second color transformation filter 700 may have the same arrangement structure.

Figure 27:
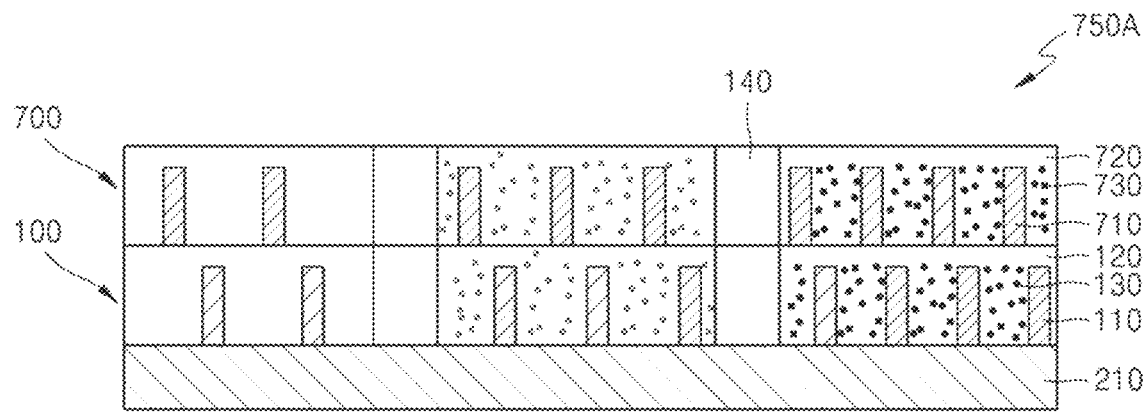
FIG. 27 is a diagram illustrating an example of changed arrangement of nanostructures in the display device of FIG. 26.

FIG. 27 is a diagram illustrating an example of changed arrangement of nanostructures in the display device of FIG. 26.

With reference to FIG. 27, in a display device 750A, the nanostructures 710 of the second color transformation filter 700 may be shifted and arranged with respect to the nanostructures 110 of the first color transformation filter 100. As illustrated in FIGS. 26 and 27, when a color transformation filter of bi-layer structure is included, resonance may occur between the color transformation filters, and intensity of output light may be increased. Although only the bi-layer structure is described herein, but a color transformation filter of three or more layers may also be stacked.

Figure 28:
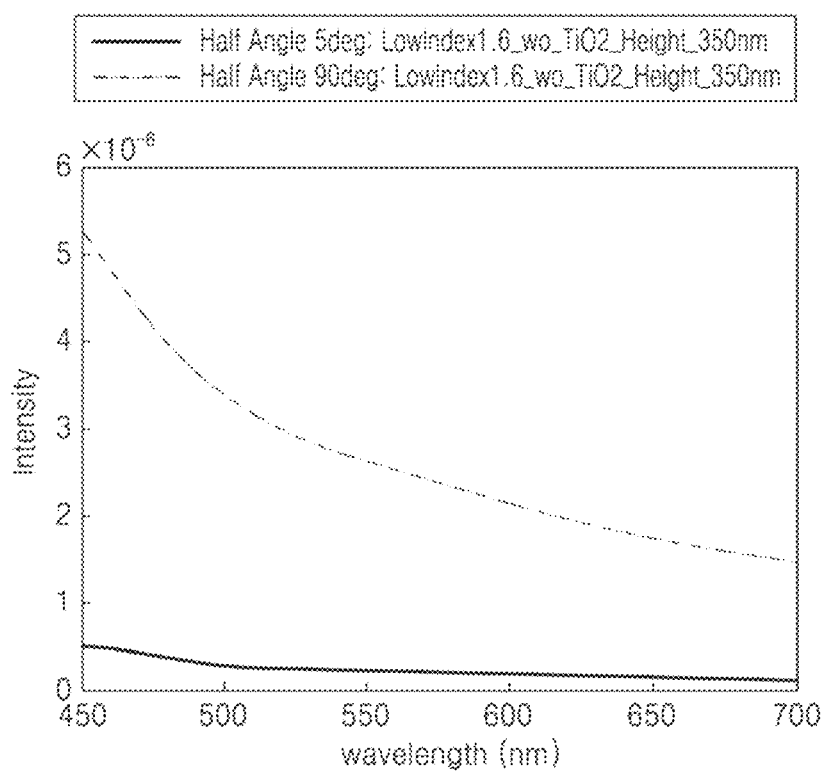
FIG. 28 shows light intensities according to wavelengths of output light in a color filter including only a color transformation element without a nanostructure according to a related example.

FIG. 28 shows light intensities according to wavelengths of output light in a color filter including only a color transformation element without a nanostructure according to a related example. A dipole of white light at a position of color transformation element may represent a light emitting spectrum at a five-degree half angle of far field. This indicates that the light source conforms to a spectrum of emitted light transformed by the color transformation element and that there are no additional color purity improvement functions other than the functions of the color transformation element. In addition, compared to the example embodiments described above, the light efficiency at the same half angle may be very low. Even when the half angle is expanded to 90 degrees, the result may be reduced by 11% compared to the result at the half degree of five degrees (see FIG. 16).

Figure 29:
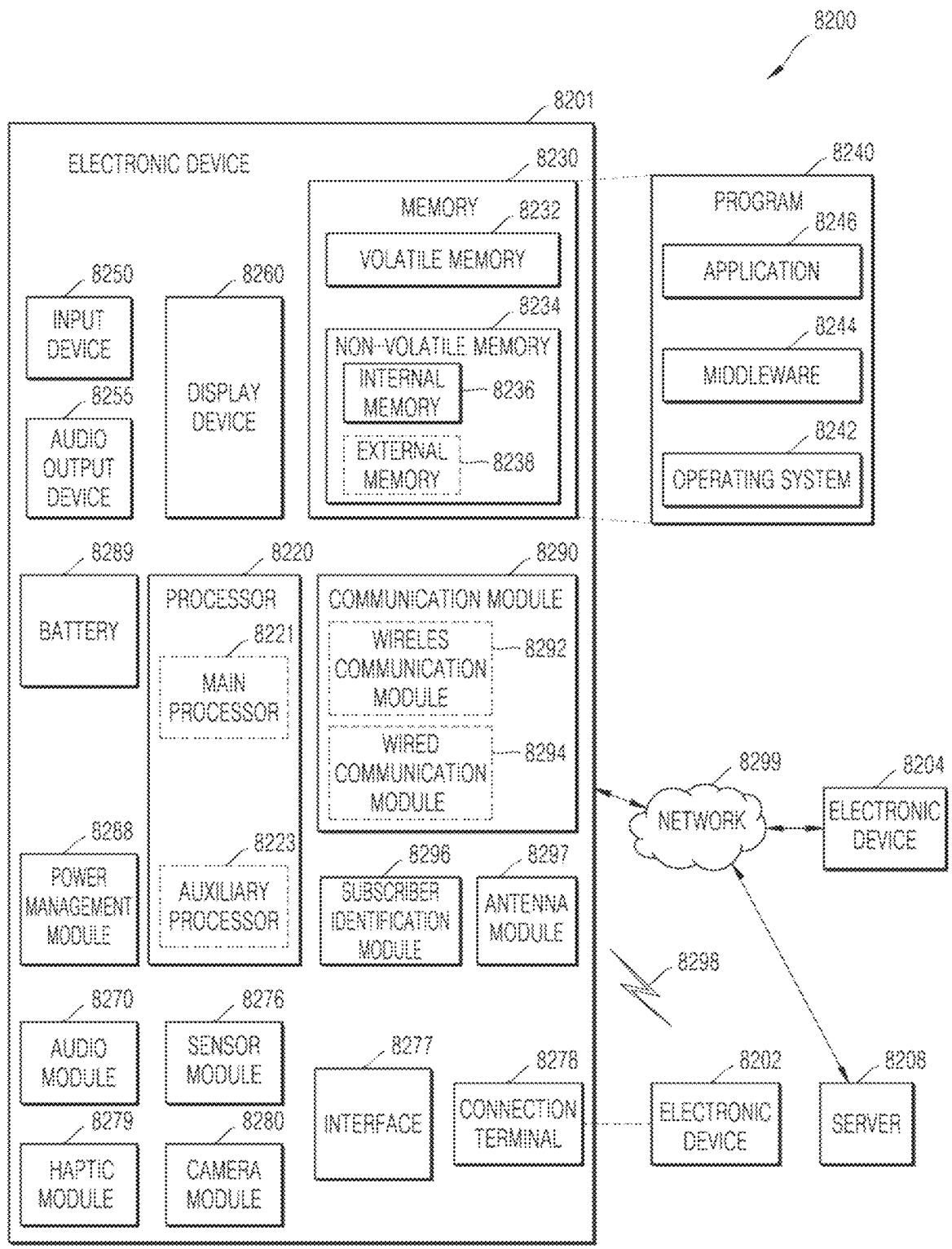
FIG. 29 is a block diagram of an electronic device including a display device according to an example embodiment.

FIG. 29 is a block diagram of an electronic device including a display device according to an example embodiment.

With reference to FIG. 29, an electronic device 8201 may be provided in a network environment 8200. In the network environment 8200, the electronic device 8201 may communicate with another electronic device 8202 through a first network 8298 (a short-range wireless communication network, etc.) or communicate with another electronic device 8204 and/or a server 8208 through a second network 8299 (a long-distance wireless communication network, etc.). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. In the electronic device 8201, some of constituent elements may be omitted or other constituent elements may be added. Some of the constituent elements may be implemented by one integrated circuit. For example, the sensor module 8276 (a fingerprint sensor, an iris sensor, an illuminance sensor, and the like) may be implemented by being embedded in the display device 8260 (a display, and the like).

The processor 8220 may control one or a plurality of other constituent elements (hardware and software constituent elements, and the like) of the electronic device 8201 connected to the processor 8220 by executing software (a program 8240, and the like), and perform various data processing or calculations. As part of the data processing or calculations, the processor 8220 may load, in a volatile memory 8232, commands and/or data received from other constituent elements (the sensor module 8276, the communication module 8290, and the like), process the command and/or data stored in the volatile memory 8232, and store result data in a non-volatile memory 8234. The non-volatile memory 8234 may include an internal memory 8236 and an external memory 8238. The processor 8220 may include a main processor 8221 (a central processing unit, an application processor, and the like) and an auxiliary processor 8223 (a graphics processing unit, an image signal processor, a sensor hub processor, a communication processor, and the like) that is operable independently of or together with the main processor 8221. The auxiliary processor 8223 may use less power than the main processor 8221 and may perform a specialized function.

Instead of the main processor 8221 when the main processor 8221 is in an inactive state (sleep state), or with the main processor 8221 when the main processor 8221 is in an active state (application execution state), the auxiliary processor 8223 may control functions and/or states related to some constituent elements (the display device 8260, the sensor module 8276, the communication module 8290, and the like) of the constituent elements of the electronic device 8201. The auxiliary processor 8223 (an image signal processor, a communication processor, and the like) may be implemented as a part of functionally related other constituent elements (the camera module 8280, the communication module 8290, and the like).

The memory 8230 may store various data needed by the constituent elements (the processor 8220, the sensor module 8276, and the like) of the electronic device 8201. The data may include, for example, software (the program 8240, and the like) and input data and/or output data about commands related thereto. The memory 8230 may include the volatile memory 8232 and/or the non-volatile memory 8234.

The program 8240 may be stored in the memory 8230 as software, and may include an operating system 8242, middleware 8244, and/or an application 8246.

The input device 8250 may receive commands and/or data to be used for constituent elements (the processor 8220, and the like) of the electronic device 8201, from the outside (a user, and the like) of the electronic device 8201. The input device 8250 may include a remote controller, a microphone, a mouse, a keyboard, and/or a digital pen (a stylus pen, and the like).

The audio output device 8255 may output an audio signal to the outside of the electronic device 8201. The audio output device 8255 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display device 8260 may visually provide information to the outside of the electronic device 8201. The display device 8260 may include a display, a hologram device, or a projector, and a control circuit to control a corresponding device. A display device 8260 may include the display device described with reference to FIGS. 1 to 28. The display device 8260 may include a touch circuitry set to detect a touch and/or a sensor circuit (a pressure sensor, and the like) set to measure the strength of a force generated by the touch.

The audio module 8270 may convert sound into electrical signals or reversely electrical signals into sound. The audio module 8270 may obtain sound through the input device 8250, or output sound through a speaker and/or a headphone of another electronic device (the electronic device 8202, and the like) connected to the audio output device 8255 and/or the electronic device 8201 in a wired or wireless manner.

The sensor module 8276 may detect an operation state (power, temperature, and the like) of the electronic device 8201, or an external environment state (a user state, and the like), and generate an electrical signal and/or a data value corresponding to a detected state. The sensor module 8276 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface 8277 may support one or more specified protocols used for the electronic device 8201 to be connected to another electronic device (the electronic device 8202, and the like) in a wired or wireless manner. The interface 8277 may include a high definition multimedia interface (HDMI), a universal serial bus (USB) interface, an SD card interface, and/or an audio interface.

A connection terminal 8278 may include a connector for the electronic device 8201 to be physically connected to another electronic device (the electronic device 8202, and the like). The connection terminal 8278 may include an HDMI connector, a USB connector, an SD card connector, and/or an audio connector (a headphone connector, and the like).

The haptic module 8279 may convert electrical signals into mechanical stimuli (vibrations, movements, and the like) or electrical stimuli that are perceivable by a user through tactile or motor sensations. The haptic module 8279 may include a motor, a piezoelectric device, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject for image capturing.

The power management module 8288 may manage power supplied to the electronic device 8201. The power management module 8288 may be implemented as a part of a power management integrated circuit (PMIC).

The battery 8289 may supply power to the constituent elements of the electronic device 8201. The battery 8289 may include non-rechargeable primary cells, rechargeable secondary cells, and/or fuel cells.

The communication module 8290 may establish a wired communication channel and/or a wireless communication channel between the electronic device 8201 and another electronic device (the electronic device 8202, the electronic device 8204, the server 8208, and the like), and support a communication through an established communication channel. The communication module 8290 may be operated independent of the processor 8220 (the application processor, and the like), and may include one or more communication processors supporting a wired communication and/or a wireless communication. The communication module 8290 may include a wireless communication module 8292 (a cellular communication module, a short-range wireless communication module, a global navigation satellite system (GNSS) communication module, and the like), and/or a wired communication module 8294 (a local area network (LAN) communication module, a power line communication module, and the like). Among the above communication modules, a corresponding communication module may communicate with another electronic device through the first network 8298 (a short-range communication network such as Bluetooth, WiFi Direct, or infrared data association (IrDA)) or the second network 8299 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module 8292 may verify and authenticate the electronic device 8201 in a communication network such as the first network 8298 and/or the second network 8299 by using subscriber information (an international mobile subscriber identifier (IMSI), and the like) stored in the subscriber identification module 8296.

The antenna module 8297 may transmit signals and/or power to the outside (another electronic device, and the like) or receive signals and/or power from the outside. An antenna may include an emitter formed in a conductive pattern on a substrate (a printed circuit board (PCB), and the like). The antenna module 8297 may include one or a plurality of antennas. When the antenna module 8297 includes a plurality of antennas, the communication module 8290 may select, from among the antennas, an appropriate antenna for a communication method used in a communication network such as the first network 8298 and/or the second network 8299. Signals and/or power may be transmitted or received between the communication module 8290 and another electronic device through the selected antenna. Other parts (an RFIC, and the like) than the antenna may be included as a part of the antenna module 8297.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device 8201 and the external electronic device 8204 through the server 8208 connected to the second network 8299. The electronic devices 8202 and 8204 may be of a type that is the same as or different from the electronic device 8201. All or a part of operations executed in the electronic device 8201 may be executed in one or more electronic devices (8202, 8204, and 8208). For example, when the electronic device 8201 needs to perform a function or service, the electronic device 8201 may request one or more electronic devices to perform part of the whole of the function or service, instead of performing the function or service. The one or more electronic devices receiving the request may perform additional function or service related to the request, and transmit a result of the performance to the electronic device 8201. To this end, cloud computing, distributed computing, and/or client-server computing technology may be used.

Figure 30:
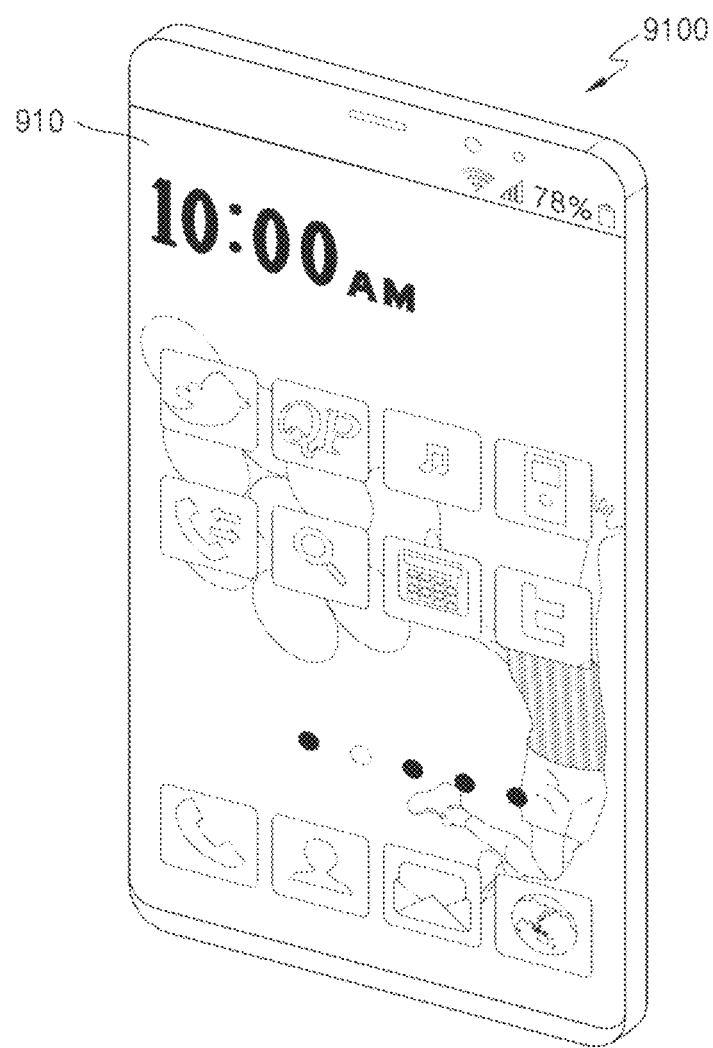
FIG. 30 shows an example in which an electronic device according to an example embodiment is applied to a mobile device.

FIG. 30 shows an example in which an electronic device according to an example embodiment is applied to a mobile device. A mobile device 9100 may include a display device 9110, and the display device 9110 may include the display devices described with reference to FIGS. 1 to 28. The display device 9110 may have a plane or foldable structure or, for example, a multi-foldable structure.

Figure 31:
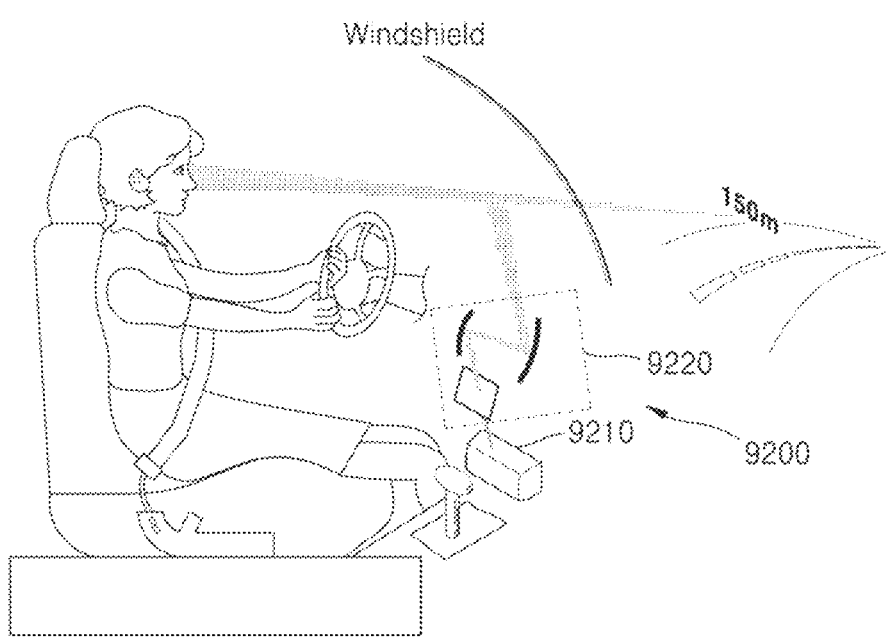
FIG. 31 shows an example in which a display device according to an example embodiment is applied to a vehicle.

FIG. 31 shows an example in which a display device according to an example embodiment is applied to a vehicle. The display device may be a head-up display device for vehicle 9200 and may include a display 9210 and an optical path change member 9220 configured to change an optical path so that a driver can see an image generated at the display 9210.

Figure 32:
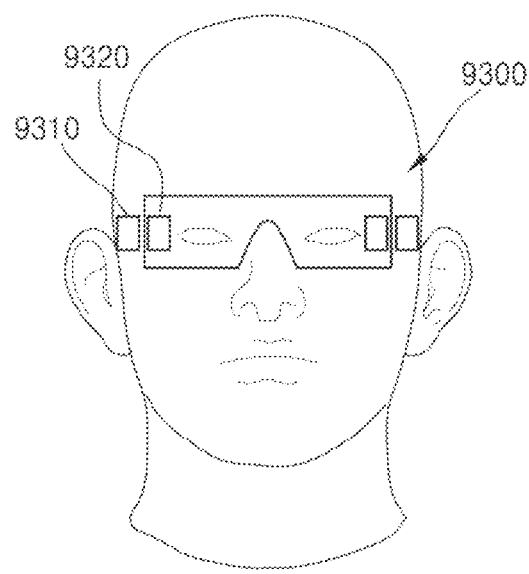
FIG. 32 shows an example in which a display device according to an example embodiment is applied to augmented reality glasses or virtual reality glasses.

FIG. 32 shows an example in which a display device according to an example embodiment is applied to augmented reality glasses or virtual reality glasses. The augmented reality glasses 9300 may include a projection system 9310 configured to form an image and an element configured to guide the image from the projection system 9310 to user's eyes. The projection system 9310 may include the display device described with reference to FIGS. 1 to 28. The augmented reality glasses 9300 may be waveguide type augmented reality glasses or holographic type augmented reality glass, and may be implemented by the electronic device described with reference to FIG. 29.

Figure 33:
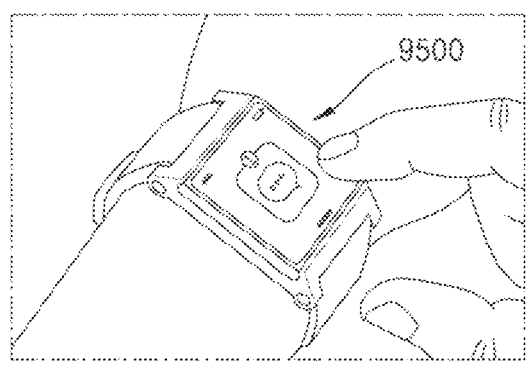
FIG. 33 shows an example in which a display device according to an example embodiment is applied to a wearable display.

FIG. 33 shows an example in which a display device according to an example embodiment is applied to a wearable display. A wearable display 9500 may include the display device described with reference to FIGS. 1 to 28, and may be implemented by the electronic device described with reference to FIG. 29.

The display device according to an example embodiment may also be applied to various products such as rollable television (TV), stretchable display, etc.

The color transformation filter according to an example embodiment may transform colors of incident light and filter color light of a particular wavelength band. The color transformation filter may perform color transformation and filtering function with one device.

The display device according to an example embodiment may increase color purity of output light by including a color transformation filter, and as it performs the color transformation and filtering function with one device, the whole thickness of the display device may be reduced, which leads to miniaturization of the display device.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A color transformation filter comprising:
   a plurality of nanostructures included in a subpixel and spaced apart from each other, the plurality of nanostructures having a first refractive index;
   a low refractive index layer provided adjacent to the plurality of nanostructures, the low refractive index layer having a second refractive index less than the first refractive index; and
   a color transformation element included in the low refractive index layer,
   wherein lower surfaces of the plurality of nanostructures and a lower surface of the low refractive index layer are located on a same plane.

2. The color transformation filter of claim 1, wherein the plurality of nanostructures are configured to output color light having a full width of half maximum less than or equal to 15 nm.

3. The color transformation filter of claim 2, wherein a full width of half maximum of color light of each subpixel is determined by at least one of a duty cycle of the plurality of nanostructures, a height of the plurality of nanostructures, and an arrangement period of the plurality of nanostructures.

4. The color transformation filter of claim 1, wherein an arrangement period of the plurality of nanostructures and a height of the plurality of nanostructures are respectively less than a wavelength of color light corresponding to the subpixel.

5. The color transformation filter of claim 1, wherein a partition wall is provided between subpixels including the subpixel.

6. The color transformation filter of claim 1, wherein the plurality of nanostructures include an oxide or a semiconductor material.

7. The color transformation filter of claim 1, wherein the plurality of nanostructures include at least one of $TiO_2$, $HfO_2$, $BaTiO_3$, and $Cr_2O_3$.

8. The color transformation filter of claim 1, wherein the plurality of nanostructures include at least one of Si, ZnS, ZnSe, GaP, InP, GaAs, GaN, and $AlAs_2$.

9. The color transformation filter of claim 1, wherein the low refractive index layer includes $SiO_2$, acrylic, or curable epoxy resin.

10. The color transformation filter of claim 1, wherein the color transformation filter has a multilayer structure.

11. The color transformation filter of claim 10, wherein the plurality of nanostructures in the multilayer structure are provided at a same position in each multilayer or are shifted in each multilayer.

12. The display device of claim 11, wherein a full width of half maximum of color light of each subpixel is determined by at least one of a duty cycle of the plurality of nanostructures, a height of the plurality of nanostructures, and an arrangement period of the plurality of nanostructures.

13. The display device of claim 12, wherein the arrangement of the plurality of nanostructures period and the height of the plurality of nanostructures are respectively less than a wavelength of color light corresponding to the subpixel.

14. A display device comprising:
   a light source; and
   a color transformation filter configured to output color light corresponding to each of subpixels based on light radiated from the light source,
   wherein the color transformation filter comprises:
      a plurality of nanostructures included in the subpixels and spaced apart from each other, the plurality of nanostructures having a first refractive index;
      a low refractive index layer provided adjacent to the plurality of nanostructures, the low refractive index layer having a second refractive index less than the first refractive index; and a color transformation element included in the low refractive index layer, wherein lower surfaces of the plurality of nanostructures and a lower surface of the low refractive index layer are located on a same plane.

15. The display device of claim 14, wherein the plurality of nanostructures are configured to output color light having a full width of half maximum less than or equal to 15 nm.

16. The display device of claim 14, wherein a partition wall is provided between subpixels including the subpixel.

17. The display device of claim 14, wherein the plurality of nanostructures include an oxide or a semiconductor material.

18. The display device of claim 14, wherein the plurality of nanostructures include at least one of TiO2, HfO2, BaTiO3, and Cr2O3.

19. The display device of claim 14, wherein the plurality of nanostructures include at least one of Si, ZnS, ZnSe, GaP, InP, GaAs, GaN, and AlAs2.

20. The display device of claim 14, wherein the low refractive index layer includes SiO2, acrylic, or curable epoxy resin.

21. The display device of claim 14, wherein the color transformation filter has a multilayer structure.

22. The display device of claim 21, wherein the plurality of nanostructures in the multilayer structure are provided at a same position in each multilayer or are shifted in each multilayer.

23. The display device of claim 14, wherein the light source comprises:
a first electrode;
an organic light emitting layer provided on the first electrode; and
a second electrode provided on the organic light emitting layer.

24. The display device of claim 23, wherein the organic light emitting layer comprises a blue light emitting layer.

25. The display device of claim 23, wherein the organic light emitting layer comprises a blue light emitting layer and a green light emitting layer.

26. The display device of claim 23, wherein the organic light emitting layer comprises:
a plurality of organic light emitting layers; and
a charge generation layer provided between adjacent organic light emitting layers among the plurality of organic light emitting layers.

27. The display device of claim 14, wherein the light source comprises:
a first electrode;
an n-type semiconductor layer;
an inorganic light emitting layer;
a p-type semiconductor layer; and
a second electrode.

28. A color transformation filter comprising:
a plurality of nanostructures included in a subpixel and spaced apart from each other, the plurality of nanostructures having a first refractive index;
a low refractive index layer provided adjacent to the plurality of nanostructures, the low refractive index layer having a second refractive index less than the first refractive index; and
a color transformation element included in the low refractive index layer,
wherein the color transformation filter has a multilayer structure, and
wherein the plurality of nanostructures in the multilayer structure are provided at a same position in each multilayer or are shifted in each multilayer in a horizontal direction, and
wherein lower surfaces of the plurality of nanostructures and a lower surface of the low refractive index layer in each layer of the multilayer structure are located on a same plane.

* * * * *